US008762438B2

(12) United States Patent  (10) Patent No.: US 8,762,438 B2
Lundvall et al.  (45) Date of Patent: *Jun. 24, 2014

(54) COMPOSITION OF DECIMAL FLOATING POINT DATA

(75) Inventors: Shawn D. Lundvall, Midlothian, VA (US); Eric M. Schwarz, Gardiner, NY (US); Ronald M. Smith, Sr., Wappingers Falls, NY (US); Phil C. Yeh, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 274 days.

This patent is subject to a terminal disclaimer.

(21) Appl. No.: 13/284,125

(22) Filed: Oct. 28, 2011

(65) Prior Publication Data

US 2012/0047190 A1  Feb. 23, 2012

Related U.S. Application Data

(63) Continuation of application No. 11/740,711, filed on Apr. 26, 2007, now Pat. No. 8,051,118.

(51) Int. Cl.
  *G06F 15/00* (2006.01)
(52) U.S. Cl.
  USPC ........................................................ 708/204
(58) Field of Classification Search
  CPC ...... H03M 7/24; G06F 9/30025; G06F 7/572; G06F 7/4876; G06F 7/491
  USPC ........................................................ 708/204
  See application file for complete search history.

(56) References Cited

U.S. PATENT DOCUMENTS

| 4,589,087 | A | 5/1986 | Auslander et al. |
| 5,697,709 | A | 12/1997 | Smith, Sr. |
| 5,825,678 | A | 10/1998 | Smith |
| 2008/0215659 | A1 | 9/2008 | Cowlishaw et al. |
| 2008/0270495 | A1 | 10/2008 | Lundvall et al. |
| 2008/0270497 | A1 | 10/2008 | Lundvall et al. |
| 2008/0270498 | A1 | 10/2008 | Lundvall et al. |
| 2008/0270499 | A1 | 10/2008 | Lundvall et al. |
| 2008/0270500 | A1 | 10/2008 | Lundvall et al. |
| 2008/0270506 | A1 | 10/2008 | Lundvall et al. |
| 2008/0270507 | A1 | 10/2008 | Lundvall et al. |
| 2008/0270509 | A1 | 10/2008 | Lundvall et al. |
| 2008/0270756 | A1 | 10/2008 | Lundvall et al. |

OTHER PUBLICATIONS

Intel 64 and IA-32 Architectures Software Developers Manual, vol. 1: Basic Architecture 253665-022US, Nov. 2006.
Intel 64 and IA-32 Architectures Software Developers Manual, vol. 2: Instruction Set Reference, A-M, 253666-022US, Nov. 2006.
Intel Itanium Architecture Software Developers Manual, vol. 1: Application Architecture, Revision 2.2, Jan. 2006, Document No. 245317-005.

(Continued)

*Primary Examiner* — Tan V. Mai
(74) *Attorney, Agent, or Firm* — William A. Kinnaman, Jr.

(57) ABSTRACT

A decimal floating point finite number in a decimal floating point format is composed from the number in a different format. A decimal floating point format includes fields to hold information relating to the sign, exponent and significand of the decimal floating point finite number. Other decimal floating point data, including infinities and NaNs (not a number), are also composed. Decimal floating point data are also decomposed from the decimal floating point format to a different format.

14 Claims, 14 Drawing Sheets

(56) References Cited

OTHER PUBLICATIONS

Intel Itanium Architecture Software Developers Manual, vol. 2: System Architecture, Revision 22, Jan. 2006, Document No. 245318-005.

Intel Itanium Architecture Software Developers Manual, vol. 3: Instruction Set Reference, Revision 2.2, Jan. 2006, Document No. 245319-005.

Draft Standard for Floating Point Arithmetic P754, Draft 1.3.0, Feb. 23, 2007.

z/Architecture—Principles of Operation, Sixth Edition, SA22-7832-05, Apr. 2007.

z/Architecture—Preliminary Decimal Floating Point Architecture, SA23-2232-00, Nov. 2006.

IEEE Standard for Binary Floating-Point Arithmetic, IEEE Std, 754-1985.

IEEE Standard for Radix Independent Floating Point Arithmetic, IEEE Std 854-1987.

Densely Packed Decimal Encodingm, Mike Cowlishaw, IEEE Proceedings—Computer and Digital Techniques, ISSN 1350-2387, vol. 149, No. 3, pp. 102-104, IEEE, May 2002 (Abstract only).

A Summary of Densely Packed Decimal Encoding, www.2.hursley.ibm.com/decimal/DPDecimal.html, 4 pages.

| BITS 12345 | BIT 6 | TYPE | BIASED EXPONENT | LMD |
|---|---|---|---|---|
| 00000 | m | FINITE NUMBER | 00 \| RBE | 0 |
| 00001 | m | FINITE NUMBER | 00 \| RBE | 1 |
| 00010 | m | FINITE NUMBER | 00 \| RBE | 2 |
| 00011 | m | FINITE NUMBER | 00 \| RBE | 3 |
| 00100 | m | FINITE NUMBER | 00 \| RBE | 4 |
| 00101 | m | FINITE NUMBER | 00 \| RBE | 5 |
| 00110 | m | FINITE NUMBER | 00 \| RBE | 6 |
| 00111 | m | FINITE NUMBER | 00 \| RBE | 7 |
| 01000 | m | FINITE NUMBER | 01 \| RBE | 0 |
| 01001 | m | FINITE NUMBER | 01 \| RBE | 1 |
| 01010 | m | FINITE NUMBER | 01 \| RBE | 2 |
| 01011 | m | FINITE NUMBER | 01 \| RBE | 3 |
| 01100 | m | FINITE NUMBER | 01 \| RBE | 4 |
| 01101 | m | FINITE NUMBER | 01 \| RBE | 5 |
| 01110 | m | FINITE NUMBER | 01 \| RBE | 6 |
| 01111 | m | FINITE NUMBER | 01 \| RBE | 7 |
| 10000 | m | FINITE NUMBER | 10 \| RBE | 0 |
| 10001 | m | FINITE NUMBER | 10 \| RBE | 1 |
| 10010 | m | FINITE NUMBER | 10 \| RBE | 2 |
| 10011 | m | FINITE NUMBER | 10 \| RBE | 3 |
| 10100 | m | FINITE NUMBER | 10 \| RBE | 4 |
| 10101 | m | FINITE NUMBER | 10 \| RBE | 5 |
| 10110 | m | FINITE NUMBER | 10 \| RBE | 6 |
| 10111 | m | FINITE NUMBER | 10 \| RBE | 7 |
| 11000 | m | FINITE NUMBER | 00 \| RBE | 8 |
| 11001 | m | FINITE NUMBER | 00 \| RBE | 9 |
| 11010 | m | FINITE NUMBER | 01 \| RBE | 8 |
| 11011 | m | FINITE NUMBER | 01 \| RBE | 9 |
| 11100 | m | FINITE NUMBER | 10 \| RBE | 8 |
| 11101 | m | FINITE NUMBER | 10 \| RBE | 9 |
| 11110 | r | INFINTY[1] | – | – |
| 11111 | 0 | QNaN[2] | – | – |
| 11111 | 1 | SNaN[2] | – | – | fig. 2A

| | |
|---|---|
| EXPLANATION: | |
| – | NOT APPLICABLE |
| \| | CONCATENATION |
| 1 | ALL BITS IN THE COMBINATION FIELD TO THE RIGHT OF BIT 5 OF THE FORMAT CONSTITUTE THE RESERVED FIELD FOR INFINITY. |
| 2 | ALL BITS IN THE COMBINATION FIELD TO THE RIGHT OF BIT 6 OF THE FORMAT CONSTITUTE THE RESERVED FIELD FOR NaN. |
| LMD | LEFTMOST DIGIT OF THE SIGNIFICAND. |
| m | BIT 6 IS A PART OF THE REMAINING BIASED EXPONENT. |
| RBE | REMAINING BIASED EXPONENT. IT INCLUDES ALL BITS IN THE COMBINATION FIELD TO THE RIGHT OF BIT 5 OF THE FORMAT. |
| r | BIT 6 IS A RESERVED BIT FOR INFINITY. |

*fig. 2B*

| FORMAT | VALUE | |
|---|---|---|
| | LEFT-UNITS VIEW | RIGHT-UNITS VIEW |
| SHORT | $\pm 10^{e-95} \times (d_0.d_1d_2...d_6)$ | $\pm 10^{e-101} \times (d_0d_1d_2...d_6)$ |
| LONG | $\pm 10^{e-383} \times (d_0.d_1d_2...d_{15})$ | $\pm 10^{e-398} \times (d_0d_1d_2...d_{15})$ |
| EXTENDED | $\pm 10^{e-6143} \times (d_0.d_1d_2...d_{33})$ | $\pm 10^{e-6176} \times (d_0d_1d_2...d_{33})$ |

EXPLANATION:

$d_0.d_1d_2...d_{p-1}$ SIGNIFICAND IN LEFT-UNITS VIEW. THE DECIMAL POINT IS TO THE IMMEDIATE RIGHT OF THE LEFTMOST DIGIT AND $d_i$ IS A DECIMAL DIGIT, WHERE $0 \leq i \leq (p-1)$ AND p IS THE FORMAT PRECISION.

$d_0d_1d_2...d_{p-1}$ SIGNIFICAND IN RIGHT-UNITS VIEW. THE DECIMAL POINT IS TO THE RIGHT OF THE RIGHTMOST DIGIT AND $d_i$ IS A DECIMAL DIGIT, WHERE $0 \leq i \leq (p-1)$ IS THE FORMAT PRECISION.

e BIASED EXPONENT.

fig. 3

| PROPERTY | FORMAT | | |
|---|---|---|---|
| | SHORT | LONG | EXTENDED |
| FORMAT LENGTH (BITS) | 32 | 64 | 128 |
| COMBINATION LENGTH (BITS) | 11 | 13 | 17 |
| ENCODED TRAILING SIGNIFICAND LENGTH (BITS) | 20 | 50 | 110 |
| PRECISION (p) | 7 | 16 | 34 |
| MAXIMUM LEFT-UNITS-VIEW (LUV) EXPONENT (Emax) | 96 | 384 | 6144 |
| MINIMUM LEFT-UNITS-VIEW (LUV) EXPONENT (Emin) | −95 | −383 | −6143 |
| LEFT UNITS-VIEW (LUV) BIAS | 95 | 383 | 6143 |
| MAXIMUM RIGHT-UNITS-VIEW (RUV) EXPONENT (Qmax) | 90 | 369 | 6111 |
| MINIMUM RIGHT-UNITS-VIEW (RUV) EXPONENT (Qmin) | −101 | −398 | −6176 |
| RIGHT-UNITS-VIEW (RUV) BIAS | 101 | 398 | 6176 |
| MAXIMUM BIASED EXPONENT | 191 | 767 | 12,287 |
| Nmax, LARGEST (IN MAGNITUDE) NORMAL NUMBER | $(10^7-1) \times 10^{90}$ | $(10^{16}-1) \times 10^{369}$ | $(10^{34}-1) \times 10^{6111}$ |
| Nmin, SMALLEST (IN MAGNITUDE) NORMAL NUMBER | $1 \times 10^{-95}$ | $1 \times 10^{-383}$ | $1 \times 10^{-6143}$ |
| Dmin, SMALLEST (IN MAGNITUDE) SUBNORMAL NUMBER | $1 \times 10^{-101}$ | $1 \times 10^{-398}$ | $1 \times 10^{-6176}$ | fig. 4

| DATA CLASS | SIGN | MAGNITUDE |
|---|---|---|
| ZERO | ± | 0* |
| SUBNORMAL | ± | $0 < |X| < N_{min}$ |
| NORMAL | ± | $N_{min} \leq |Y| \leq N_{max}$ |
| EXPLANATION: *THE COEFFIECINT IS ZERO AND THE EXPONENT IS ANY REPRESENTABLE VALUE | | | fig. 5

| DATA CLASS | SIGN | BITS 1-5 | REMAINING BITS IN COMBINATION FIELD |
|---|---|---|---|
| INFINITY | ± | 11110 | XXX ... XXX |
| QUIET NaN | ± | 11111 | 0XX ... XXX |
| SIGNALING NaN | ± | 11111 | 1XX ... XXX | fig. 6

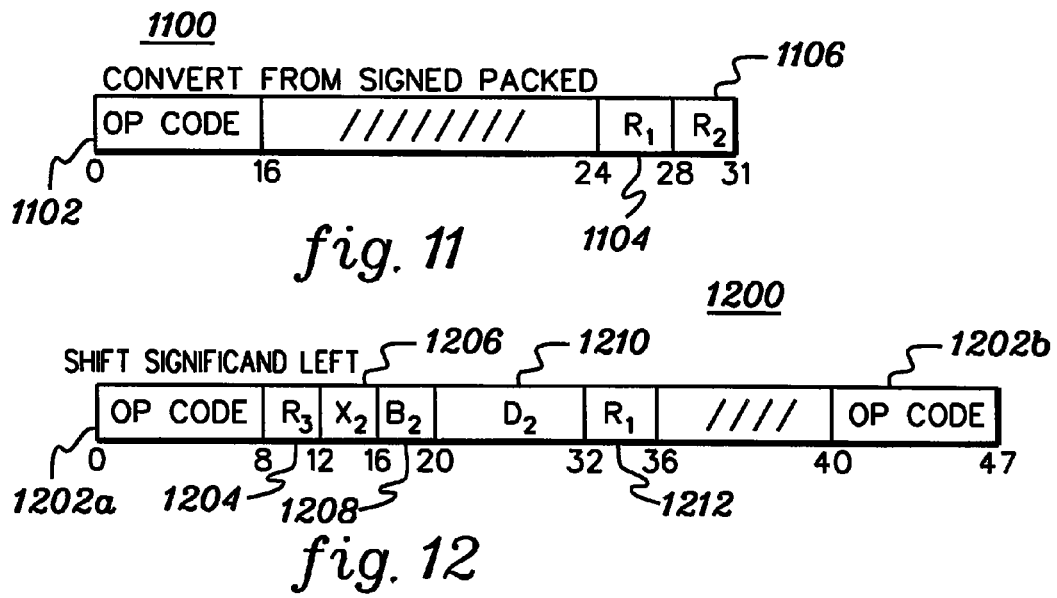
fig. 11
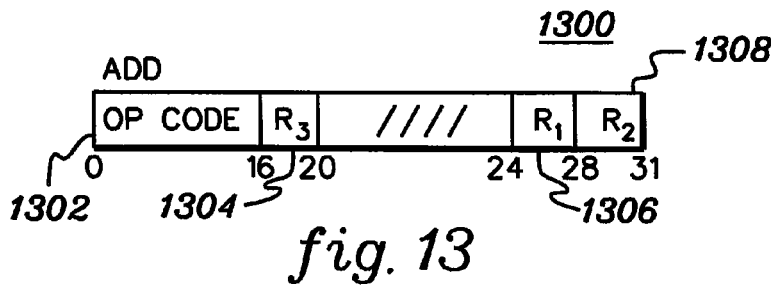
fig. 12
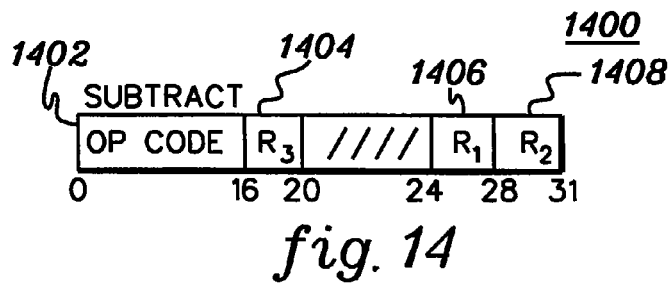
fig. 13
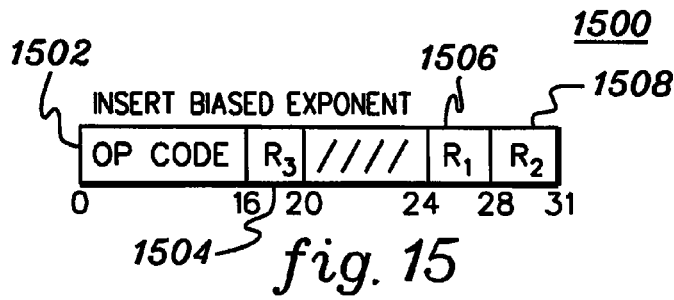
fig. 14
fig. 15

COMPOSITION OF DECIMAL FLOATING POINT DATA

CROSS-REFERENCE TO RELATED APPLICATIONS

This application is a continuation of U.S. patent application Ser. No. 11/740,711, filed Apr. 26, 2007, entitled "COMPOSITION/DECOMPOSITION OF DECIMAL FLOATING POINT DATA," the entirety of which is hereby incorporated herein by reference.

TECHNICAL FIELD

This invention relates, in general, to employing decimal floating point data in processing within a processing environment, and in particular, to composing decimal floating point data in a decimal floating point format from data that are not represented in a decimal floating point format. Moreover, aspects of the invention relate to decomposing decimal floating point data.

BACKGROUND OF THE INVENTION

Floating point is used to represent real numbers on computers. There are different types of floating point arithmetic, including binary floating point and decimal floating point, as examples. Floating point numbers are discussed in IEEE Std 854-1987, IEEE Standard for Radix-Independent Floating-Point Arithmetic; and in IEEE Std 754-1985, IEEE Standard For Binary Floating-Point Arithmetic, which are hereby incorporated herein by reference in their entirety.

Binary floating point numbers are represented in computer hardware as base two (binary) fractions. While binary floating point has been very valuable over the years, there are some limitations with binary floating point operations. For instance, binary floating point cannot represent some decimal fractions, such as 0.1; and the scaling of binary floating point requires rounding. Due to the limitations of binary floating point, decimal floating point has evolved for use in computational processing in computers and other processing environments.

Decimal floating point is easier to comprehend, since decimal data is the most common of all numeric data. A decimal floating point finite number includes a sign bit, an exponent and a significand. The sign bit is zero for plus and one for minus. The exponent, a signed value, is represented as an unsigned binary value by adding a bias, resulting in a biased exponent. The significand includes a string of decimal digits, where each digit is an integral value between zero and one less than the radix (i.e., 10 is the radix for decimal). The number of digit positions in the significand is called the precision of the floating point number.

SUMMARY OF THE INVENTION

Typically, data that is input to a processing environment is in a format other than a decimal floating point format. For instance, a human-readable format of numerical data that is, for instance, in decimal character strings, may be input to the processing environment. Thus, if decimal floating point data is to be used in processing, the data is first converted from the human-readable format to an intermediate format, and then the data in the intermediate format is used to compose data in the decimal floating point format. Each decimal floating point format includes fields to hold information on the sign, the exponent, and the significand of a decimal floating point finite number.

In one example, to convert a decimal floating point finite number in human-readable format into a decimal floating point format, the human-readable data is first converted into an intermediate data type, and then from the intermediate data type to a decimal floating point format. The intermediate data type is to be able to support the conversion without loss of accuracy. One example of an intermediate data type that meets this criteria is signed packed decimal for the sign and the significand, and signed binary integer for the exponent. Thus, in this example, the sign and the significand of the human-readable input are converted to signed packed decimal and the exponent of the human-readable input is converted to a signed binary integer, then from signed packed decimal and signed binary integer to a decimal floating point format.

Therefore, a need exists for a capability that provides data conversion from an intermediate data type, like signed packed decimal and signed binary integer, to a decimal floating point format. Further, a need exists for a capability that provides data conversion from the decimal floating point format to an intermediate data type.

The shortcomings of the prior art are overcome and additional advantages are provided through the provision of an article of manufacture that includes at least one computer usable medium having computer readable program code logic to compose a decimal floating point data. The computer readable program code logic when executing performing, for instance, the following: obtaining a significand in a packed decimal format and a biased exponent in a binary integer format; and combining the significand and biased exponent into a decimal floating point datum in decimal floating point format.

Methods and systems relating to one or more aspects of the present invention are also described and claimed herein.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIGS. 2A-2B depict one example of the encoding and layout of the combination field of FIGS. 1A-1C, in accordance with an aspect of the present invention;

FIG. 3 depicts examples of values of finite numbers in the various formats of FIGS. 1A-1C, in accordance with an aspect of the present invention;

FIG. 4 depicts one example of various properties of the three decimal floating point formats of FIGS. 1A-1C, in accordance with an aspect of the present invention;

FIG. 5 depicts one embodiment of value ranges for finite number data classes of decimal floating point data, in accordance with an aspect of the present invention;

FIG. 6 depicts one example of the encoding of not a number (NaNs) and infinity data classes of decimal floating point data, in accordance with an aspect of the present invention;

FIG. 11 depicts one example of a format of a Convert From Signed Packed instruction used in accordance with an aspect of the present invention;

FIG. 12 depicts one embodiment of a format of a Shift Significand Left instruction used in accordance with an aspect of the present invention;

FIG. 13 depicts one example of a format of an Add instruction used in accordance with an aspect of the present invention;

FIG. 14 depicts one example of a format of a Subtract instruction used in accordance with an aspect of the present invention;

FIG. 15 depicts one example of a format of an Insert Biased Exponent instruction used in accordance with an aspect of the present invention;

DETAILED DESCRIPTION OF THE INVENTION

Figure 1A:
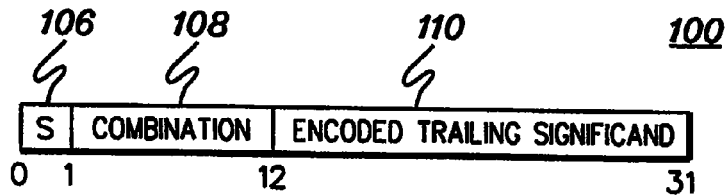
FIG. 1A depicts one embodiment of a short data format of a decimal floating point datum, in accordance with an aspect of the present invention.

In accordance with an aspect of the present invention, a capability is provided for composing decimal floating point (DFP) data. For instance, a datum in a format other than a decimal floating point format is converted to a decimal floating point format. This conversion converts the exponent and significand separately, in one example. The capability employs, in one embodiment, a plurality of instructions or logic that facilitate the conversion and composition.

As a further aspect of the present invention, a capability is provided for decomposing the decimal floating point data. For instance, a decimal floating point datum is converted to a format other than a decimal floating point format. This capability also employs, in one embodiment, a plurality of instructions or logic that facilitate the conversion and decomposition.

A decimal floating point finite number includes three components: a sign bit, an exponent, and a significand. The magnitude (an unsigned value) of the number is the product of the significand and the radix (10 for DFP) raised to the power of the exponent. The number is positive or negative depending on whether the sign bit is zero or one, respectively.

The significand has an implied radix point, and its position depends on which interpretation of the floating point datum is being applied. This interpretation is called a view. There are multiple views that can be applied to a floating point format, and each view is an interpretation of the meaning of the fields in a floating point datum, and an implied radix point. Examples of the multiple views include a fraction view, a left units view and a right units view. With the fraction view, the radix point is implied to be to the left of the leftmost digit of the significand. With the left units view, the leftmost digit of the significand is assumed to be the units digit and the radix point is implied to be immediately to the right of this digit. With the right units view, the rightmost digit of the significand is assumed to be the units digit and the radix point is implied to be immediately to the right of the entire significand. Although all three views can be applied to a floating point format, in the examples described herein, the right units view is applied to DFP, unless otherwise noted. Thus, for the significand, the implied radix point is immediately to the right of the significand.

The use of different views has an affect on the definition of unbiased exponent and the bias. The value of the floating point number is defined to be the product of the significand times the base raised to the power of the unbiased exponent. Since different views place the assumed radix point at different positions in the significand, to keep the value the same, the unbiased exponent is to change by a corresponding amount, and the bias to convert between the biased exponent and the unbiased exponent is to change. This results in different exponent and bias terms including: fraction view exponent, left units view (LUV) exponent, right units view (RUV) exponent, fraction view bias, left units view bias and right units view bias.

The representation of decimal floating point finite numbers allows leading zeros and trailing zeros in the significand. This allows some numbers to have multiple representations. Each representation has a different combination of significand and exponent. For example, $1000000 \times 10^5$ and $10 \times 10^{10}$ are two different representations of the same number. This number representation carries information about both the numerical value and the quantum of a decimal floating point finite number. The set of different representations of a decimal floating point number using the same sign is called a cohort. Each of these multiple representations is called a cohort member. A plus zero and a minus zero have the same value, but are in different cohorts.

For a DFP finite number, the magnitude of a value of one in the rightmost digit position of the significand is called the quantum. Each cohort member of a cohort uses a different quantum to represent the same value. The quantum of a cohort member is the same, regardless of whether the left units view or right units view is taken.

For operations that produce a DFP result, a quantum, called the preferred quantum, is defined to select a cohort member to represent the delivered value, if it is a finite number. The preferred quanta for these operations are depicted in the below table. When the delivered value is exact, the preferred quantum depends on the operation. When the delivered value is inexact, the preferred quantum is the smallest quantum, unless otherwise stated.

In the absence of an overflow or underflow interruption, if the delivered value is a finite number, the cohort member with the quantum closest to the preferred quantum is selected.

In the case of an overflow or underflow interruption, the cohort member with the quantum closest to the scaled preferred quantum is selected. The scaled preferred quantum is obtained by scaling the preferred quantum using the same scale factor that was used to obtain the delivered value.

Examples of preferred quantum for various operations are depicted below.

| Operations | Delivered Value | Preferred Quanta |
|---|---|---|
| ADD | Exact | The smaller quantum of the two source operands † |
|  | Inexact | The smallest quantum |
| CONVERT FROM FIXED | Exact | One † |
|  | Inexact | The smallest quantum |
| CONVERT FROM SIGNED PACKED | — | One |
| CONVERT FROM UNSIGNED PACKED | — | One |
| DIVIDE | Exact | The quantum of the dividend divided by the quantum of the divisort † |
|  | Inexact | The smallest quantum |
| INSERT BIASED EXPONENT | — | The quantum corresponds to the requested biased exponent |
| LOAD AND TEST | — | The quantum of the source operand |
| LOAD FP INTEGER | Exact | The larger value of one and the quantum of the source operand |
|  | Inexact | One |
| LOAD LENGTHENED | Exact | The quantum of the source operand † |
|  | Inexact | The smallest quantum |
| LOAD ROUNDED | Exact | The quantum of the source operand † |
|  | Inexact | The smallest quantum |
| PERFORM FLOATING POINT OPERATION (DPQC = 0) | Exact | The largest quantum † |
|  | Inexact | The smallest quantum |
| PERFORM FLOATING POINT OPERATION (DPQC = 1) | Exact | One † |
|  | Inexact | The smallest quantum |
| MULTIPLY | Exact | The product of the quanta of the two source operands † |
|  | Inexact | The smallest quantum |

-continued

| Operations | Delivered Value | Preferred Quanta |
|---|---|---|
| QUANTIZE | Exact | The requested quantum |
|  | Inexact | The requested quantum |
| REROUND | Exact | The larger value of the quantum that corresponds to the requested significance and the quantum of the source operand |
|  | Inexact | The quantum that corresponds to the requested significance |
| SHIFT SIGNIFICAND LEFT | — | The quantum of the source operand |
| SHIFT SIGNIFICAND RIGHT | — | The quantum of the source operand |
| SUBTRACT | Exact | The smaller quantum of the two source operands † |
|  | Inexact | The smallest quantum |

Explanation:
— For these operations, the concept of exact result or inexact result does not apply.
† If the delivered value cannot be represented with the preferred quantum, it is represented with the quantum closest to the preferred quantum.
DPQC DFP preferred quantum control.

Decimal floating point numbers may be represented in any of three data formats: short, long, or extended. As examples, the short format includes 32 bits, the long format 64 bits, and the extended format 128 bits.

NaNs (Not a Number) and other symbols, such as infinity, may also be represented in any of the three data formats. A NaN is a value or symbol that is usually produced as a result of an operation on invalid operands. There are quiet NaNs and signaling NaNs. A quiet NaN, in most instances, does not raise any additional exceptions as it propagates through operations, such as decimal floating point operations. On the other hand, a signaling NaN does raise additional exceptions.

Figure 1B:
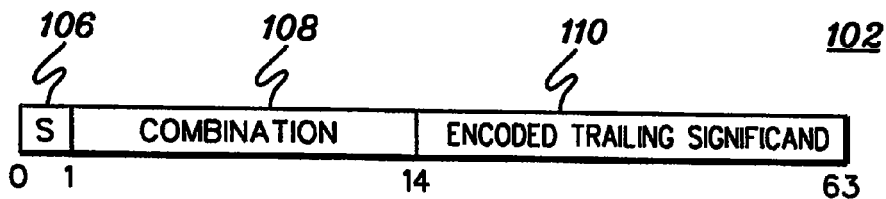
FIG. 1B depicts one embodiment of a long data format of a decimal floating point datum, in accordance with an aspect of the present invention.
Figure 1C:
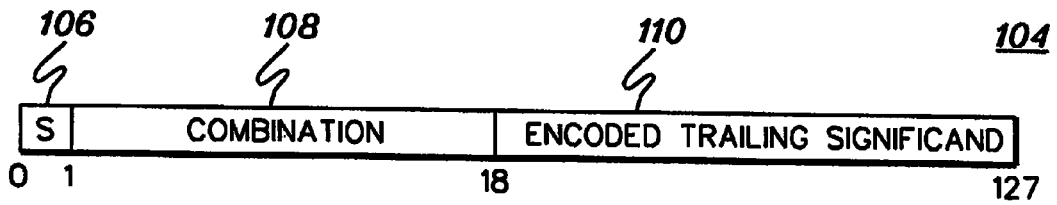
FIG. 1C depicts one embodiment of an extended data format of a decimal floating point datum, in accordance with an aspect of the present invention.

The contents of each data format represent encoded information. Special codes are assigned to NaNs and infinities. Examples of the formats are described with reference to FIGS. 1A-1C. For instance, FIG. 1A depicts one example of a short data format representation 100 of a decimal floating point datum; FIG. 1B depicts one example of a long data format representation 102 of a decimal floating point datum; and FIG. 1C depicts one embodiment of an extended data format representation 104 of a decimal floating point datum.

Each data format is of a different length, but has the same fields. The fields include, for instance, the following:

A sign field (S) 106 represents the sign bit of the decimal floating point datum. In one example, it is bit 0 in each format, and is set to zero for plus and one for minus;

A combination field 108: For finite numbers, this field includes the biased exponent and the leftmost digit of the significand; for NaNs and infinities, this field includes codes to identify them.

When bits 1-5 of the format are in the range of 00000-11101, the operand is a finite number. The two leftmost bits of the biased exponent and the leftmost digit of the significand are encoded in bits 1-5 of the format. Bit 6 through the end of the combination field includes the rest of the biased exponent.

When bits 1-5 of the format field are 11110, the operand is an infinity. All bits in the combination field to the right of bit 5 of the format constitute the reserved field for infinity. A nonzero value in the reserved field is accepted in a source infinity; the reserved field is set to zero in a resultant infinity.

When bits 1-5 of the format are 11111, the operand is a NaN and bit 6, called the SNaN bit, further distinguishes QNaN from SNaN. If bit 6 is zero, then it is QNaN;

otherwise, it is SNaN. All bits in the combination field to the right of bit 6 of the format constitute the reserved field for NaN. A nonzero value in the reserved field is accepted in a source NaN; the reserved field is set to zero in a resultant NaN.

FIGS. 2A-2B summarize the encoding and layout of the combination field. In the figures, the biased exponent of a finite number is the concatenation of two parts: (1) two leftmost bits are derived from bits 1-5 of the format, and (2) the remaining bits in the combination field. For example, if the combination field of the DFP short format includes 10101010101 binary, it represents a biased exponent of 10010101 binary and a leftmost significant digit of 5.

An encoded trailing significand 110 (FIGS. 1A-1C): This field includes an encoded decimal number, which represents digits in the trailing significand. The trailing significand includes all significand digits, except the leftmost digit. For infinities, nonzero trailing significand digits are accepted in a source infinity; all trailing significand digits in a resultant infinity are set to zeros, unless otherwise stated. For NaNs, this field includes diagnostic information called the payload.

In one example, the trailing significand digits in a DFP data format are encoded by representing three decimal digits with a 10-bit declet. The digits in the trailing significand are encoded using densely packed decimal encoding. Examples of densely packed decimal encoding are described in "A Summary of Densely Packed Decimal Encoding," Mike Cowlishaw, Jul. 16, 2005, www2.hursley.ibm.com/decimal/DPDecimal.html, and "Densely Packed Decimal Encoding," Mike Cowlishaw, IEEE Proceedings—Computers and Digital Techniques, ISSN 1350-2387, Vol. 149, No. 3, pp. 102-104, IEEE, May 2002, each of which is hereby incorporated herein by reference in its entirety.

Each of the three data formats has different values of finite numbers. Examples of these values in the various formats are shown in FIG. 3. As depicted, values are provided for both the left units view 300 and right units view 302 for each format, including the short format 304, long format 306 and extended format 308.

As described above, in one example, a decimal floating point number includes a sign, an exponent, and a significand. The sign is encoded, for instance, as a one bit binary value and is represented in sign field 106. The significand is encoded, for instance, as an unsigned decimal integer in two distinct parts: the leftmost digit (LMD) of the significand is encoded as part of combination field 108; and the remaining digits of the significand are encoded in encoded trailing significand 110. Similarly, the exponent is represented in two parts, as an example. However, prior to encoding the exponent, the exponent is converted to an unsigned binary value, called the biased exponent, by adding a bias value, which is a constant for each format. The two leftmost bits of the biased exponent, as well as the remaining 6, 8, or 12 bits (depending on the format) are also encoded in combination field 108. This encoding is pictorially depicted in FIG. 1D.

Figure 1D:
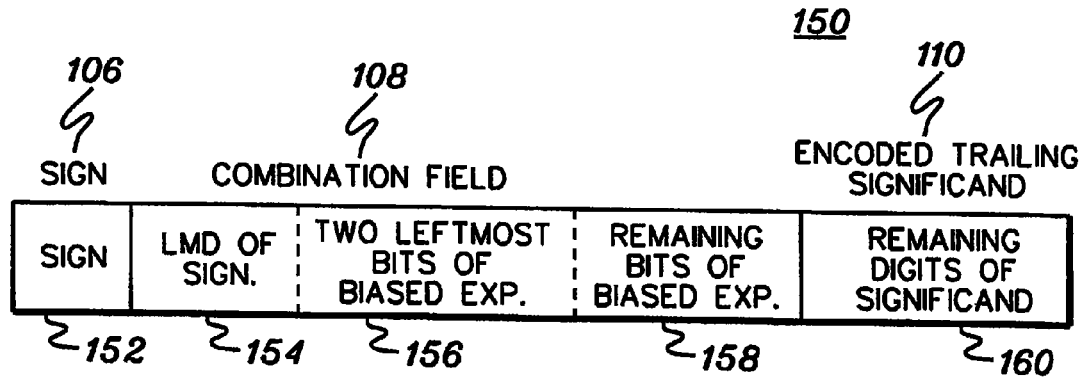
FIG. 1D pictorially depicts an encoding of a decimal floating point datum, in accordance with an aspect of the present invention.

As shown in FIG. 1D, an encoding 150 of a decimal floating point number includes a sign 152 in sign field 106; the leftmost digit of the significand 154, the two leftmost bits of the biased exponent 156 and the remaining bits of the biased exponent 158 in combination field 108; and the remaining digits of the significand 160 in encoded trailing significand 110.

Each of the three data formats for decimal floating point numbers has properties associated therewith. These properties are summarized in FIG. 4. As depicted, properties 400 include for each format 402 the following, as examples: format length 404, combination length 406, encoded trailing significand length 408, precision 410, maximum left units view (LUV) exponent ($E_{max}$) 412, minimum left units view exponent ($E_{min}$) 414, left units view bias 416, maximum right units view (RUV) exponent ($Q_{max}$) 418, minimum right units view exponent ($Q_{min}$) 420, right units view bias 422, maximum biased exponent 424, largest (in magnitude) normal number ($N_{max}$) 426, smallest (in magnitude) normal number ($N_{min}$) 428, and smallest (in magnitude) subnormal number ($D_{min}$) 430.

In addition to the above, decimal floating point data is categorized into six classes of data, including zero, subnormal number, normal number, infinity, signaling NaN and quiet NaN data classes. The value of a decimal floating point finite number, including zero, subnormal number, and normal number, is a quantization of the real number based on the data format. The value ranges for finite number data classes are depicted in FIG. 5, and the codes for NaNs and infinity are depicted in FIG. 6.

For instance, FIG. 5 shows a sign 502 and a magnitude 504 for each data class 500, including zero data class 506, subnormal data class 508, and normal data class 510. As shown, a subnormal number has a value smaller than $N_{min}$ (smallest normal number) and greater than zero in magnitude. A normal number is a nonzero finite number whose magnitude is between $N_{min}$ and $N_{max}$ (largest normal number) inclusively.

Similarly, FIG. 6 shows, in one embodiment, a sign 602, an encoding of bits 1-5 of the combination field 604, and an encoding of the remaining bits of the combination field 606 of the data format for each data class 600, including infinity data class 610, quiet NaN data class 612, and signaling NaN data class 614.

As part of a decimal floating point operation, in which the source operands are finite numbers, a precise intermediate value is first produced, which is the value that would have been computed if both the precision and exponent range were unbounded. Then, a rounded intermediate value is produced. That is, except when otherwise specified, the precise intermediate value is rounded to the precision of the target format, but with unbounded exponent range. This process is called target precision constrained rounding, and the value selected by this type of rounding is called the precision rounded value.

For IEEE targets, when the IEEE underflow interruption is disabled and the tininess condition exists, the precise intermediate value is rounded to fit in the destination format. That is, with both precision and exponent range of the target format. This process is called denormalization rounding and the value selected by this type of rounding is called the denormalized value.

In other examples, a source operand is taken and modified to fit in a subset of the destination format. This process is called functionally constrained rounding and the value selected by this type of rounding is called the functionally rounded value.

In any particular instance, only one of the three rounding processes is performed and the value selected (precision rounded value, denormalized value, or functionally rounded value) is generically referred to as the rounded intermediate value.

In the absence of overflow and underflow interruptions, the rounded intermediate value is used as the delivered value. For overflow and underflow interruptions, the rounded intermediate value is divided by a scale factor to produce a scaled value, which is used as the delivered value.

As described above, a decimal floating point datum is highly encoded in that more information is packed into less space. For instance, for a decimal floating point finite number, the combination field includes a portion of the significand, as well as the exponent. Since the decimal floating point data is highly encoded, composition of decimal floating point data is not trivial.

One embodiment of an overview of the logic associated with importing a decimal floating point data from a non-decimal floating point format is described with reference to FIG. 7. In this particular example, the non-decimal floating point format is a human readable format.

Figure 7:
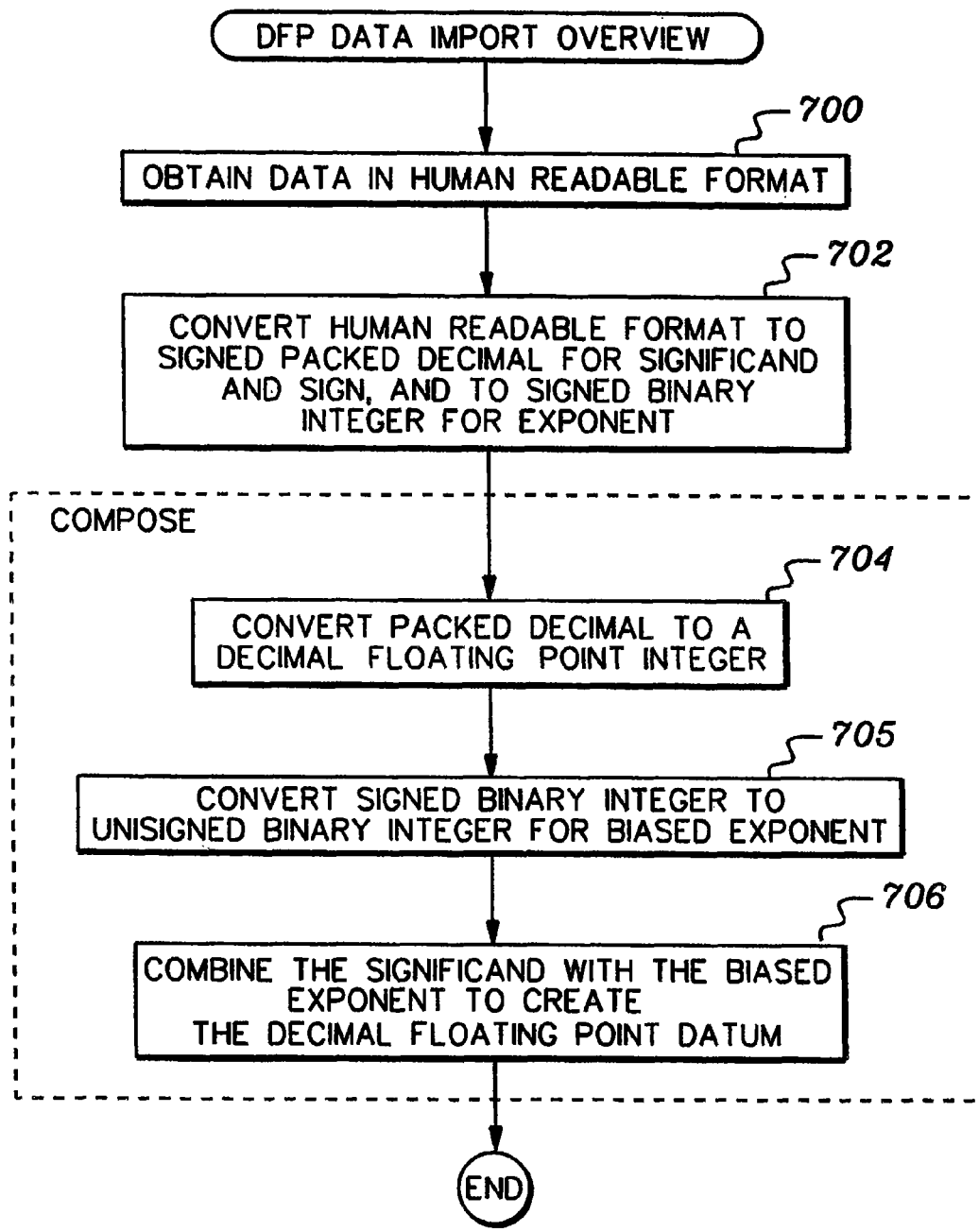
FIG. 7 depicts one embodiment of an overview of the logic associated with importing a decimal floating point datum from a non-decimal floating point format, in accordance with an aspect of the present invention.

Referring to FIG. 7, in one embodiment, a human readable data value, such as a decimal numerical value, is obtained by a processor of a processing environment, STEP 700. In one example, the value is input by a user. The inputted value is converted from its human readable form to an intermediate form, such as packed decimal and signed binary integer, STEP 702.

There are two packed decimal formats, in one example: signed packed and unsigned packed. In the signed packed decimal format, each byte includes, for instance, two decimal digits (D), except for the rightmost byte, which includes a sign (S) to the right of a decimal digit.

In the unsigned packed decimal format, each byte includes, for instance, two decimal digits (D) and there is no sign.

Techniques to convert from human-readable format to packed decimal and binary integer are known in the art. Many processing environments, including an environment based on the z/Architecture® offered by International Business Machines Corporation, include functions to convert to packed decimal and binary integer. z/Architecture® is a registered trademark of International Business Machines Corporation, Armonk, N.Y.

Referring to STEP 704, at least a portion of the significand in the intermediate form is then converted to a decimal floating point value, and the exponent in the intermediate form is converted to a biased exponent in unsigned binary integer, STEP 705. The converted values are then used in composing the decimal floating point datum, STEP 706.

Further details regarding converting from packed decimal and binary integer to a DFP format and for composing a floating point datum are described with reference to FIG. 8. In particular, one embodiment of the logic associated with converting the significand from a packed decimal value and the biased exponent from a binary integer to a decimal floating point format is described.

As one example, the technique is described with reference to an example in which a 35 digit (34 digit significand and 1 digit sign) signed significand (stored as packed decimal) and its associated scaling factor (stored as a 64-bit binary integer) are converted to an extended decimal floating point format. This example addresses the problem in which 35 digits in packed decimal require more than 128 bits.

Initially, a value is loaded into a general register pair AB, STEP 800. The register pair is selected from a plurality (e.g., 16) of available general registers. In one embodiment, the first register of the pair that is selected is an even register and the next register of the pair is the odd register immediately succeeding the even register. In this example, sixty-four bits are loaded into each general register of the general register pair, with the upper (most significant) 12 bits of the binary coded decimal packed number (3 digits out of 35) right aligned in the register pair and the left 116 bits zeroed.

Additionally, a general register pair CD, which is also selected from the plurality of available registers, is loaded with the lower 128 bits (least significant 31 digits and sign) of the packed decimal, STEP 802. It is assumed that the signed digit is the rightmost digit.

Further, a general register, Register E, selected from the plurality of available registers is loaded with the associated biased exponent, which in this example is a 64-bit binary integer, STEP 804. Thus, the sign, significand and biased exponent are loaded in general registers, as indicated above.

Next, the contents of general register pair AB are converted into a decimal floating point number, which is a portion of the significand of the decimal floating point datum being composed, STEP 806. The converted decimal floating point number is stored in a selected floating point register pair, such as floating point register pair 01. In one example, the conversion is performed using a Convert From Unsigned Packed instruction, which is described below.

Additionally, the packed decimal in the general register pair CD is converted into a decimal floating point format and the result is stored in a selected floating point register pair, such as floating point register pair 23, STEP 808. In one example, this conversion is performed using a Convert From Signed Packed instruction, as described in further detail below.

Thereafter, the significand of the floating point register pair 01 is shifted 31 digits to the left to align it for operations with floating point register pair 23, STEP 810. The shifting is performed by a Shift Significand Left instruction, in one example. The shift does not affect the exponent or sign of the decimal floating point data.

Subsequently, a determination is made as to whether the original significand in the packed decimal format is positive, INQUIRY 812. If the original significand in the packed decimal format is positive, then the contents of floating point register pair 01 are added to the contents of floating point register pair 23, and the result is stored into floating point register pair 01, STEP 814. In one example, this add is performed using an Add instruction, which is described in further detail below.

However, if the original significand in the packed decimal format is negative, INQUIRY 812, then the contents of floating point register pair 01 are subtracted from the contents of floating point register pair 23, and the result is stored in floating point register pair 01, STEP 816. A Subtract instruction is used, in one example, to perform the subtraction.

Subsequent to performing either the add or subtract, the contents of register E are combined with the contents of floating point register pair 01, and placed back into floating point register pair 01, STEP 818. In one example, an Insert Biased Exponent instruction is used to perform this combination. This results in a composed DFP data representation of the 35 digit significand in packed decimal and its associated scaling factor in binary integer. However, in other examples, the composition can be from other types of non-decimal floating point formats.

In the previous examples, the intermediate form includes a signed significand in the signed packed decimal format. Two examples are now given where the intermediate form includes an unsigned significand in the unsigned packed decimal format along with a separate bit for the sign. In these examples, the significand and the sign are converted separately. As in the previous examples, the intermediate form also includes a 64-bit biased exponent in the binary integer format. In both examples, the unsigned significand in the intermediate form is first converted to a positive integer in the DFP format. As in the previous examples, the Insert Biased Exponent instruction is then used to combine the 64-bit biased exponent in the intermediate form with the integer in the DFP format. Also, in both examples, if the result is to be negative, the sign bit is set to one. This could be done in many ways, such as a logical OR and may be performed before or after the Insert Biased Exponent instruction.

For the first example, the unsigned significand in the intermediate form is a 34-digit value in the unsigned packed decimal format and it is converted to a positive integer in the DFP extended format using the Convert From Unsigned Packed, Shift Significand Left, and Add instructions. The Convert From Signed Packed and Subtract instructions are not needed.

For the second example, the unsigned significand in the intermediate form is a 16-digit value in the unsigned packed decimal format and it is converted to a positive integer in the DFP long format by a single execution of the Convert From Unsigned Packed instruction. The Convert From Signed Packed, Shift Significand Left, Add, and Subtract instructions are not needed.

In the above logic for composing a decimal floating point datum, a number of instructions are employed. These instructions can be implemented in many architectures and may be emulated. As examples, the instructions are executed in hardware by a processor; by software executing on a processor having a native instruction set; or by emulation of a non-native instruction set that includes the instruction. In one particular example, the instructions are implemented in the z/Architecture® offered by International Business Machines Corporation, Armonk, N.Y. z/Architecture® is a registered trademark of International Business Machines Corporation, Armonk, N.Y. Other names used herein may be registered trademarks, trademarks or product names of International Business Machines Corporation or other companies. One embodiment of the z/Architecture® is described in "z/Architecture Principles of Operation," IBM Publication No. SA22-7832-05, 6th Edition, April 2007, which is hereby incorporated herein by reference in its entirety and which shows one example of the various instructions. Further details regarding the instructions, as well as additional details relating to decimal floating point, and in particular, to a decimal floating architecture offered by International Business Machines Corporation, are described in an IBM publication entitled "Preliminary Decimal-Floating-Point Architecture," IBM Publication No. SA23-2232-00, November 2006, which is hereby incorporated herein by reference in its entirety. Each of the instructions is also described in further detail herein.

One instruction used to convert the packed decimal value to a decimal floating point value (see, e.g., STEP 806, FIG. 8) is the Convert From Unsigned Packed instruction 900, which is described with reference to FIG. 9. In one example, instruction 900 is a 32-bit instruction in format RRE (register and register operation having an extended opcode) as that format is defined in the IBM® z/Architecture Principles of Operation. It includes, for instance:

An operation code 902 (e.g., bits 0-15) designating the Convert From Unsigned Packed instruction. In this example, there are two possible operation codes: one for a 64-bit unsigned packed decimal source in general register, long DFP result; and another for a 128-bit unsigned packed decimal source in general registers, extended DFP result.

A register field 904 (e.g., $R_1$, bits 24-27) designating a floating point register or a floating point register pair, the contents of which are a first operand used by the instruction.

A register field 906 (e.g., $R_2$, bits 28-31) designating a general register or general register pair, the contents of which are a second operand used by the instruction. The second operand is an unsigned BCD number.

The preferred quantum is one, and the delivered value is represented with the preferred quantum.

The result placed at the first operand location is canonical. A finite number is canonical when all declets are canonical declets. An infinity is canonical when the reserved field is zero and all digits in the trailing significand are zeros. A NaN is canonical when the reserved field is zero and all declets are canonical declets.

To further explain, the trailing significand digits in a DFP data format are encoded by representing three decimal digits with a 10-bit declet. Of the 1024 possible declets, 1000 canonical declets are produced in resultant DFP operands, and 24 noncanonical declets are not produced as DFP results. Both canonical and noncanonical declets are accepted in source DFP operands.

The following table shows the 24 noncanonical declets, the decimal value to which each maps, and the corresponding canonical declet to which this decimal value maps.

| Noncanonical Declets (Hex) | | | Map To Decimal Value | Canonical Declets (Hex) |
|---|---|---|---|---|
| 16E | 26E | 36E | 888 | 06E |
| 16F | 26F | 36F | 889 | 06F |
| 17E | 27E | 37E | 898 | 07E |
| 17F | 27F | 37F | 899 | 07F |
| 1EE | 2EE | 3EE | 988 | 0EE |
| 1EF | 2EF | 3EF | 989 | 0EF |
| 1FE | 2FE | 3FE | 998 | 0FE |
| 1FF | 2FF | 3FF | 999 | 0FF |

When an invalid digit code is detected in the second operand, a decimal operand data exception is recognized.

When the opcode of the Convert From Unsigned Packed instruction indicates a 128 bit unsigned packed decimal source, the $R_1$ field designates a valid floating point register pair. Also, the $R_2$ field designates an even-odd pair of general registers, with the even numbered register being specified.

During execution of the Convert From Unsigned Packed instruction, the second operand in the unsigned packed decimal format is converted to the DFP format with a positive sign, and the result is placed at the first operand location.

In one embodiment, to convert from an unsigned packed decimal number to a decimal floating point format, a hardware internal working format of the unsigned packed decimal number is created and that working format is used to create the DFP format. This is described in further detail with reference to FIG. 10A.

Figure 10A:
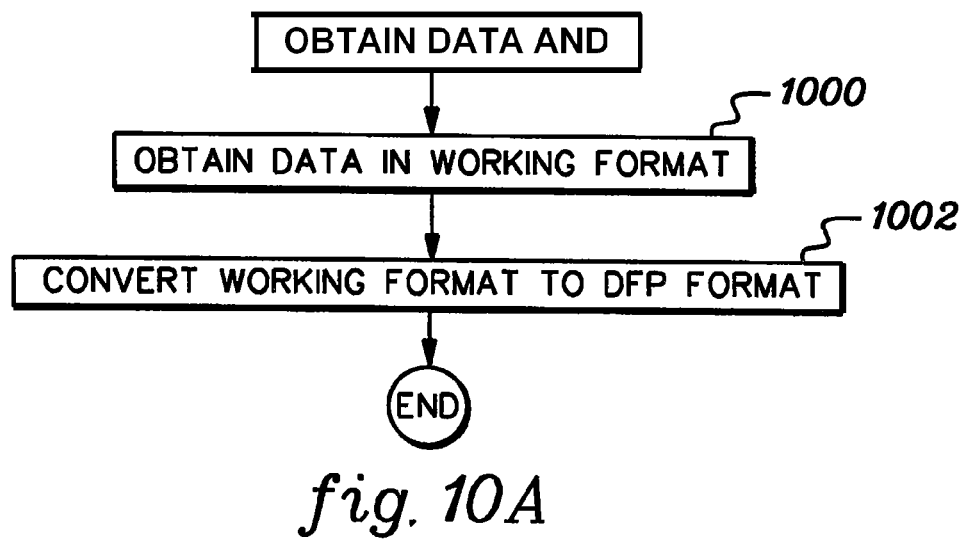
FIG. 10A depicts one embodiment of the logic associated with a compress function used in accordance with an aspect of the present invention.

Referring to FIG. 10A, initially a value in unsigned packed decimal format in the second operand of the instruction is converted to a working format, STEP 1000, as described below.

The working format (W) of a DFP data includes four primary fields, for instance: (W=S∥T∥E∥D), where ∥ is concatenation and:

Primary Fields

S: Sign

T: Type (SNaN, QNaN, Infinity, Finite Number)

E: Biased exponent

D: Significand Digits

Secondary Fields

Two of the primary fields are further broken down into secondary fields:

E1: leftmost two bits of the biased exponent
E2: remaining bits of the biased exponent
D1: leftmost digit of the significand
D2: remaining digits of the significand Thus:

E=E1||E2
D=D1||D2

During execution of the instruction, the data in the unsigned packed decimal format of the second operand is converted to the working format, as indicated above. That is, the sign, which in this case is set to positive, of the data in unsigned packed decimal format is indicated at S. The type, which in this case is a finite number, is indicated at T. The biased exponent, which in one example, is obtained from a table, is indicated at E; and the significand digits are indicated at D. Again, E includes E1 and E2; and D includes D1 and D2.

The working format is used to produce the data in a DFP format. In particular, the working format is converted to a DFP format, STEP 1002. As one example, a compress function (G) is used to convert the working format (W) to the DFP format (p). This can be shown symbolically as p=G(W).

In one embodiment, compress involves the following four steps:

s=S
a=G1(T,E1,D1)
b=E2
c=G2(D2)

G includes two subfunctions G1 and G2. Subfunction G1 uses the type field (T), the leftmost two bits of the biased exponent (E1), and the leftmost digit of the significand (D1) to form part of the combination field (a). In particular, the 3 fields (T, E1 and D1) are used to obtain an encoding of the combination field. Examples of the encoding are shown in FIGS. 2A-2B. Thus, if for instance, T represents a finite number, E1 is 2 and D1 is 5, the encoding (from FIG. 2A) is 10101.

Subfunction G2 converts the remaining digits of the significand (D2) to the encoded trailing significand field (c). Each 3-digit BCD number in D2 is converted to a 10-bit Densely Packed Decimal (DPD) value. One example of a technique to convert to a DPD value is described in "A Summary of Densely Packed Decimal Encoding," Mike Cowlishaw, Jul. 16, 2005, www2.hursley.ibm.com/decimal/DP-Decimal.html, and "Densely Packed Decimal Encoding," Mike Cowlishaw, IEEE Proceedings—Computers and Digital Techniques, ISSN 1350-2387, Vol. 149, No. 3, pp. 102-104, IEEE, May 2002. Details are also provided below.

The digits in the trailing significand of a decimal floating point datum are encoded using densely packed decimal (DPD) encoding. Translation operates on three Binary Coded Decimal (BCD) digits at a time converting the 12 bits into 10 bits with a technique that can be applied or reversed using simple Boolean operations. In the following examples, a 3-digit BCD number is represented as (abcd)(efgh)(ijkm), a 10-bit DPD number is represented as (pqr)(stu)(v)(wxy), and the boolean operations, & (AND), | (OR), and ¬ (NOT) are used.

The conversion from a 3-digit BCD number to a 10-bit DPD can be performed through the following Boolean operations.

p=(a & f & i)|(a & j)|b
q=(a & g & i)|(a & k)|c
r=d
s=(¬ a & e & j)|(f & ¬ i)|(¬ a & f)|(e & i)
t=(¬ a & e & k)|(a & i)|g
u=h
v=a|e|i
w=(¬ e & j)|(e & i)|a
x=(¬ a & k)|(a & i) e
y=m

Alternatively, the following table can be used to perform the conversion. The most significant bit of the three BCD digits (left column) is used to select a specific 10-bit encoding (right column) of the DPD.

| aei | prq stu v wxy |
|-----|---------------|
| 000 | bcd fgh 0 jkm |
| 001 | bcd fgh 1 00m |
| 010 | bcd jkh 1 01m |
| 011 | bcd 10h 1 11m |
| 100 | jkd fgh 1 10m |
| 101 | fgd 01h 1 11m |
| 110 | jkd 00h 1 11m |
| 111 | 00d 11h 1 11m |

As described above, the BCD to DPD encoding provides a value for the encoded trailing significand field. Thus, the compress function provides the sign and encoded trailing significand field (i.e., DFP format) of the packed decimal number in register pair AB. It also provides the combination field.

This compress function is also used by the Convert From Signed Packed instruction, which is employed in converting the decimal value in signed packed decimal format in the register pair CD to a DFP format (see, e.g., STEP 808, FIG. 8), as described below.

One example of a format of the Convert From Signed Packed instruction 1100 is described with reference to FIG. 11. In one example, instruction 1100 is a 32 bit instruction in format RRE (register and register operation having an extended opcode) as that format is defined in the IBM® z/Architecture Principles of Operation. It includes, for instance:

An operation code 1102 (e.g., bits 0-15) designating the Convert From Signed Packed instruction. In this example, there are two possible operation codes: one for a 64-bit signed packed decimal source, long DFP result; and another for a 128-bit signed packed decimal source, extended DFP result.

A register field 1104 (e.g., $R_1$, bits 24-27) designating a floating point register or a floating point register pair, the contents of which are a first operand used by the instruction.

A register field 1106 (e.g., $R_2$, bits 28-31) designating a general register or general register pair, the contents of which are a second operand used by the instruction. The second operand is a signed packed decimal number.

The preferred quantum is one, and the delivered value is represented with the preferred quantum.

The result placed at the first operand location is canonical.

When an invalid digit or sign code is detected in the second operand, a decimal operand data exception is recognized.

When the opcode of the Convert From Signed Packed instruction indicates conversion of a 128-bit source, the $R_1$ field designates a valid floating point register pair. Also, the $R_2$ field designates an even-odd pair of general registers, with the even numbered register being specified.

During execution of the Convert From Signed Packed instruction, the signed packed decimal number in the second operand is converted to a DFP number, and the result is placed at the first operand location.

This conversion also creates a working format of the signed packed decimal number, and from that working format produces a DFP representation of the signed packed decimal number, as described herein with reference to FIG. 10A.

Figure 8:
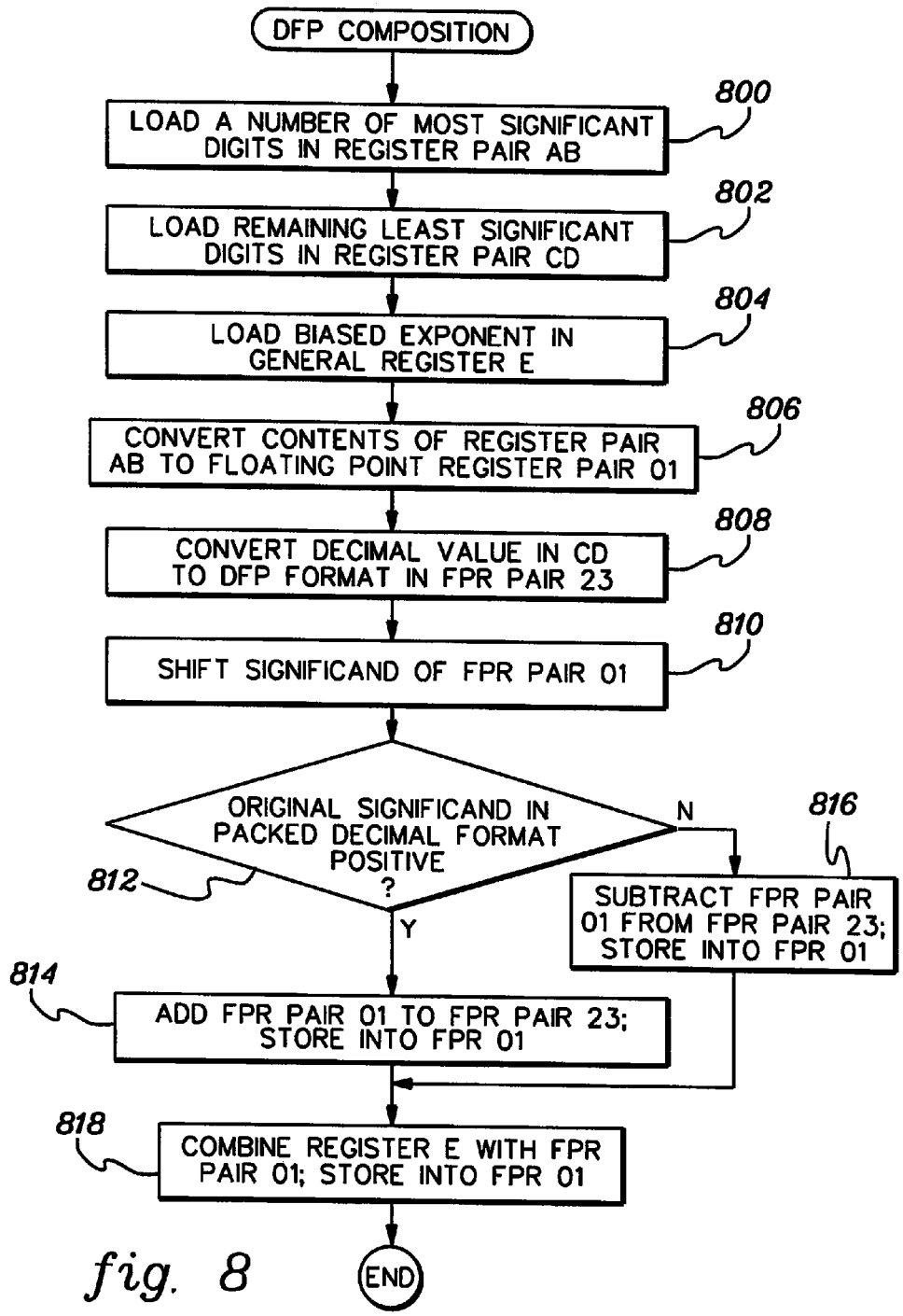
FIG. 8 depicts further details of one embodiment of the logic associated with composing a decimal floating point datum, in accordance with an aspect of the present invention.
Figure 9:
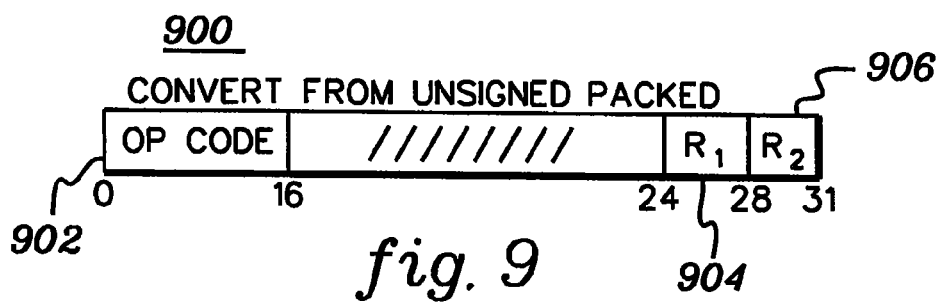
FIG. 9 depicts one example of a format of a Convert From Unsigned Packed instruction used in accordance with an aspect of the present invention.

Another instruction used during the composition of a DFP datum is a Shift Significand Left instruction (see, e.g., STEP 810, FIG. 8). One example of a format of the Shift Significand Left instruction 1200 is described with reference to FIG. 12. In one example, instruction 1200 is a 48-bit instruction in format RXF (register and index storage operation having an extended opcode field and an additional register field) as that format is defined in the IBM® z/Architecture Principles of Operation. It includes, for instance:

An operation code 1202a (e.g., bits 0-7), 1202b (e.g., bits 40-47) designating the Shift Significand Left instruction. In this example, there are two possible operation codes: one for long decimal floating point operand, and another for an extended decimal floating point operand.

A register field 1204 (e.g., $R_3$, bits 8-11) designating a floating point register or a floating point register pair, the contents of which are a third operand used by the instruction.

An index field 1206 (e.g., $X_2$, bits 12-15) designating a general register having, for instance, a 64-bit number.

A base field 1208 (e.g., $B_2$, bits 16-19) designating a general register having, for instance, a 64-bit number.

A displacement value 1210 having, for instance, a 12-bit number.

The contents of the general registers specified in fields 1206 and 1208, if any, are added to the contents of displacement value 1210 to form a second operand address. The second operand address is not used to address data; instead, its rightmost six bits indicate the number of digits to be shifted. The remainder of the address is ignored.

A register field 1212 (e.g., $R_1$, bits 32-35) designating another floating point register or floating point register pair used by the instruction, the contents of which are a first operand used by the instruction.

In operation of this instruction, the significand of the third operand is shifted left the number of digits specified by the second operand address, and the result is placed at the first operand location.

Digits shifted out of the leftmost digit are lost. Zeros are supplied to the vacated positions on the right. The sign of the result is the same as the sign of the third operand.

For a finite number, all digits in the significand participate in the shift and the result is a finite number with the same biased exponent as the third operand and the shifted significand. For an infinity, all digits in the trailing significand participate in the shift, and the result is an infinity with the shifted trailing significand and a zero in the reserved field of the format. For a QNaN or SNaN, all digits in the trailing significand participate in the shift and the result is a QNaN or SNAN, respectively, with the shifted trailing significand and a zero in the reserved field of the format.

The preferred quantum is the quantum of the third operand. If the delivered value is a finite number, it is represented with the preferred quantum.

The result placed at the first operand location is canonical, except for infinity. When the result is an infinity, if all digits in the trailing significand of the result are zeros, then the result is canonical; otherwise, the result is an infinity that has the reserved field set to zero, canonical declets in the encoded trailing significand field, and some nonzero digits in the trailing significand.

This operation is performed for any second operand, including an infinity, QNaN, or SNaN, without causing an IEEE exception.

When the opcode of the Shift Significand Left instruction indicates an extended DFP operation, the $R_1$ and $R_3$ fields designate valid floating point register pairs.

To perform the Shift, in one example, an expand function is used to convert the data to be shifted in a DFP format to a working format. The shift is performed on the working format, and then the compress function is performed to convert the working format into the DFP format. The compress function is described above; however, one example of an expand function is described below with reference to FIG. 10B.

Figure 10B:
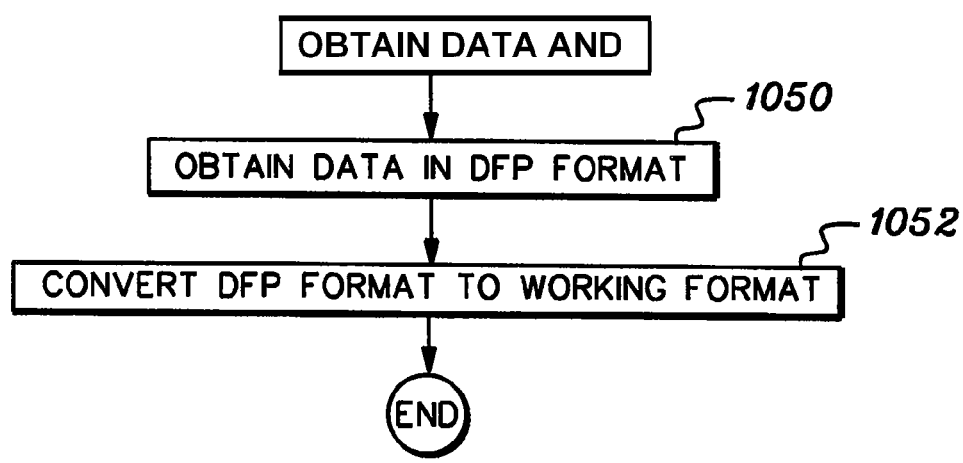
FIG. 10B depicts one embodiment of the logic associated with an expand function used in accordance with an aspect of the present invention.

Referring to FIG. 10B, initially, a DFP datum in DFP format is obtained, STEP 1050. In this particular example, the datum is the third operand of the Shift Significand Left instruction. The datum, which is in a DFP format and has a trailing significand in the densely packed decimal format, is converted to a working format, which includes a trailing significand in the packed decimal format, STEP 1052, as described below.

An expand function (F) converts the DPF format (p) to the working format (W). This can be shown symbolically as W=F(p). Expansion involves, for instance, eight steps, as follows:

S=s
T=F1(a)
E1=F2(a)
D1=F3(a)
E2=b
D2=F4(c)
E=E1∥E2
D=D1∥D2

F includes four subfunctions F1, F2, F3, and F4. Subfunctions F1, F2, and F3 use the combination field (a) to form the type field (T), the leftmost two bits of the biased exponent (E1), and the leftmost digit of the significand (D1). Subfunction F4 converts the contents of the encoded trailing significand field (c) to the remaining digits of the significand (D2). Each 10-bit DPD value in (c) is converted to a 3-digit BCD number, as described below and in "A Summary of Densely Packed Decimal Encoding," Mike Cowlishaw, Jul. 16, 2005, www2.hursley.ibm.com/decimal/DPDecimal.html, and "Densely Packed Decimal Encoding," Mike Cowlishaw, IEEE Proceedings—Computers and Digital Techniques, ISSN 1350-2387, Vol. 149, No. 3, pp. 102-104, IEEE, May 2002.

The conversion from a 10-bit DPD to a 3-digit BCD number can be performed through the following Boolean operations.

a=(v & w) & (¬s|t|¬x)
b=p & (¬v|¬w|(s & ¬t & x))
c=q & (¬v|¬w|(s & ¬t & x))
d=r
e=v & ((¬w & x)|(¬t & x)|(s & x))
f=(s & (¬v|¬x))|(p & ¬s & t & v & w & x)
g=(t & (¬v|¬x))|(q & ¬s & t & w)
h=u
i=v & ((¬w & ¬x)|(w & x & (s|t)))
j=(¬v & w)|(s & v & ¬w & x)|(p & w & (¬x|(¬s & ¬t)))
k=(¬v & x)|(t & ¬w & x)|(q & v & w & (¬x|(¬s & ¬t)))
m=y

Alternatively, the following table can be used to perform the conversion. A combination of five bits in the DPD encoding (leftmost column) are used to specify conversion to the 3-digit BCD encoding. Dashes (–) in the table are don't cares, and can be either one or zero.

| vxwst | abcd | efgh | ijkm |
|-------|------|------|------|
| 0---- | 0pqr | 0stu | 0wxy |
| 100-- | 0pqr | 0stu | 100y |
| 101-- | 0pqr | 100u | 0sty |
| 110-- | 100r | 0stu | 0pqy |
| 11100 | 100r | 100u | 0pqy |
| 11101 | 100r | 0pqu | 100y |
| 11110 | 0pqr | 100u | 100y |
| 11111 | 100r | 100u | 100y |

After converting the DFP format to the working format, the shift is performed by shifting the digits of the significand in the working format (packed decimal), and then compress is performed to convert the working format back to the DFP format.

Another instruction that may be employed in the composition of a DFP entity is the Add instruction. One example of a format of an Add instruction 1300 is described with reference to FIG. 13. In one example, instruction 1300 is a 32-bit instruction in format RRR (non-destructive 3 register operation) as that format is defined in the IBM® z/Architecture Principles of Operation. It includes, for instance:

An operation code 1302 (e.g., bits 0-15) designating the Add instruction. In this example, there are two possible operation codes: one for a long DFP format, and the other for an extended DFP format.

A register field 1304 (e.g., $R_3$, bits 16-19) designating a floating point register or a floating point register pair, the contents of which are a third operand.

A register field 1306 (e.g., $R_1$, bits 24-27) designating a floating point register or a floating point register pair, the contents of which are a first operand.

A register field 1308 (e.g., $R_2$, bits 28-31) designating a floating point register or a floating point register pair, the contents of which are a second operand.

During execution of the Add instruction, the third operand is added to the second operand, and the sum is placed at the first operand location.

The second and third operands in the DFP format are converted to the working format using the expand function. The Add operation is performed on data in the working format. The result in the working format is converted to the DFP format using the compress function.

If both operands are finite numbers, they are added algebraically, forming an intermediate sum. The intermediate sum, if nonzero, is rounded to the operand according to the current DFP rounding mode (described below). The sum is then placed at the result location.

The sign of the sum is determined by the rules of algebra. This also applies to a result of zero:

If the result of rounding a nonzero intermediate sum is zero, the sign of the zero result is the sign of the intermediate sum.

If the sum of two operands with opposite signs is exactly zero, the sign of the result is plus in all rounding modes except round toward $-\infty$, in which mode the sign is minus.

The sign of the sum x plus x is the sign of x, even when x is zero.

If one operand is an infinity and the other is a finite number, the result is an infinity with the sign of the source infinity. If both operands are infinities of the same sign, the result is an infinity with the same sign. If the two operands are infinities of opposite signs, an IEEE invalid operation condition is recognized.

When the delivered value is exact, the preferred quantum is the smaller quantum of the two source operands. When the delivered value is inexact, the preferred quantum is the smallest quantum.

The result placed at the first operand location is canonical.

When the opcode of the Add instruction indicates an extended DFP, the R fields designate valid floating point register pairs.

One example of the results for the Add instruction are summarized in the below table.

| Second operand (b) is | Results for ADD (b + c) when Third Operand (c) is | | | | | | | | |
|---|---|---|---|---|---|---|---|---|---|
| | $-\infty$ | $-Nn$ | $-Dn$ | $-0$ | $+0$ | $+Dn$ | $+Nn$ | $+\infty$ | QNaN | SNaN |
| $-\infty$ | T($-\infty$), cc1 | T($-\infty$), cc1 | T($-\infty$), cc1 | T($-\infty$), cc1 | T($-\infty$), cc1 | T($-\infty$), cc1 | T($-\infty$), cc1 | Xi: T(dNaN), cc3 | T(c), cc3 | Xi: T(c*), cc3 |
| $-Nn$ | T($-\infty$), cc1 | R(b + c), cc1 | R(b + c), cc1 | T(b), cc1 | T(b), cc1 | R(b + c), cc1 | R(b + c), ccrs | T($+\infty$), cc2 | T(c), cc3 | Xi: T(c*), cc3 |
| $-Dn$ | T($-\infty$), cc1 | R(b + c), cc1 | R(b + c), cc1 | R(b), cc1 | R(b), cc1 | R(b + c), ccrs | R(b + c), cc2 | T($+\infty$), cc2 | T(c), cc3 | Xi: T(c*), cc3 |
| $-0$ | T($-\infty$), cc1 | T(c), cc1 | R(c), cc1 | T($-0$), cc0 | Rezd, cc0 | R(c), cc2 | T(c), cc2 | T($+\infty$), cc2 | T(c), cc3 | Xi: T(c*), cc3 |
| $+0$ | T($-\infty$), cc1 | T(c), cc1 | R(c), cc1 | Rezd, cc0 | T($+0$), cc0 | R(c), cc2 | T(c), cc2 | T($+\infty$), cc2 | T(c), cc3 | Xi: T(c*), cc3 |
| $+Dn$ | T($-\infty$), cc1 | R(b + c), cc1 | R(b + c), ccrs | R(b), cc2 | R(b), cc2 | R(b + c), cc2 | R(b + c), cc2 | T($+\infty$), cc2 | T(c), cc3 | Xi: T(c*), cc3 |
| $+Nn$ | T($-\infty$), cc1 | R(b + c), ccrs | R(b + c), cc2 | T(b), cc2 | T(b), cc2 | R(b + c), cc2 | R(b + c), cc2 | T($+\infty$), cc2 | T(c), cc3 | Xi: T(c*), cc3 |
| $+\infty$ | Xi: T(dNaN), cc3 | T($+\infty$), cc2 | T($+\infty$), cc2 | T($+\infty$), cc2 | T($+\infty$), cc2 | T($+\infty$), cc2 | T($+\infty$), cc2 | T($+\infty$), cc2 | T(c), cc3 | Xi: T(c*), cc3 |

-continued

| Second operand (b) is | Results for ADD (b + c) when Third Operand (c) is | | | | | | | | | |
|---|---|---|---|---|---|---|---|---|---|---|
| | −∞ | −Nn | −Dn | −0 | +0 | +Dn | +Nn | +∞ | QNaN | SNaN |
| QNaN | T(b), cc3 | T(b), cc3 | T(b), cc3 | T(b), cc3 | T(b), cc3 | T(b), cc3 | T(b), cc3 | T(b), cc3 | T(b), cc3 | Xi: T(c*), cc3 |
| SNaN | Xi: T(b*), cc3 | Xi: T(b*), cc3 | Xi: T(b*), cc3 | Xi: T(b*), cc3 | Xi: T(b*), cc3 | Xi: T(b*), cc3 | Xi: T(b*), cc3 | Xi: T(b*), cc3 | Xi: T(b*), cc3 | Xi: T(b*), cc3 |

Explanation:
*The SNaN is converted to the corresponding QNaN before it is placed at the target operand location.
ccn Condition code is set to n.
ccrs Condition code is set according to the resultant sum.
dNaN Default quiet NaN. A quiet NaN with a positive sign, zeros in the reserved field, and zeros in the trailing significand.
Nn Normal number.
R(v) Rounding is performed on the value v. The result is canonical.
Rezd Exact zero-difference result.
Dn Subnormal number.
T(x) The canonical result x is placed at the target operand location.
Xi: IEEE invalid operation exception. The results shown are produced only when FCP 0.0. is zero.

As examples, for CCRS, above, if the value of the result (r) is zero, then a condition code of zero is set. Similarly, if r is less than zero, a condition code of 1 is set, and if r is greater than zero, a condition code of two is set.

The Add instruction refers to rounding mode. Thus, further details regarding DFP rounding and rounding mode are described below.

Rounding takes an input value, and, using the effective rounding method, selects a value from the permissible set. The input value, considered to be infinitely precise, may be an operand of an instruction or the numeric output from an arithmetic operation. The effective rounding method may be the current rounding method specified in a rounding mode field of a control register; or, for some instructions, an explicit rounding method is specified by a modifier field.

For target precision constrained rounding and denormalization rounding, the input is the precise intermediate value. For functionally constrained rounding, the input is a source operand.

Rounding selects a value from the permissible set. A permissible set is a set of values, and not representations; thus, for DFP, the selection of a member from the cohort is considered to be performed after rounding. A permissible set differs from the values representable in a particular format in the following way:

1. A permissible set does not include infinity. Infinity is handled as a special case.
2. For target precision constrained rounding, the permissible set is considered to have an unbounded exponent range.
3. For denormalization rounding, the permissible set is limited to the values representable in a particular format.

If a member of the permissible set is equal in value to the input value, then that member is selected; otherwise, two adjacent candidates with the same sign as the input value are chosen from the permissible set. One candidate, called TZ (toward zero), is the member of the permissible set nearest to and smaller in magnitude than the input value; the other candidate, called AZ (away from zero), is the member of the permissible set nearest to and larger in magnitude than the input value. Which of the two candidates is selected depends on the rounding method.

The following are example rounding methods:
Round to nearest with ties to even: The candidate nearest to the input value is selected. In case of a tie, the candidate selected is the one whose voting digit has an even value.
Round toward 0: The candidate that is smaller in magnitude is selected.
Round toward +∞: The candidate that is algebraically greater is selected.
Round toward −∞: The candidate that is algebraically less is selected.
Round to nearest with ties away from 0: The candidate nearest to the input value is selected. In case of a tie, the candidate selected is the one that is larger in magnitude.
Round to nearest with ties toward 0: The candidate nearest to the input value is selected. In case of a tie, the candidate selected is the one that is smaller in magnitude.
Round away from 0: The candidate that is greater in magnitude is selected.
Round to prepare for shorter precision: The candidate selected is smaller in magnitude, unless its voting digit has a value of either 0 or 5; in that case, the candidate that is greater in magnitude is selected.

Three rounding methods depend on a condition called a "tie." This condition exists when the two candidates are equidistant from the input value.

Two rounding methods depend on the value of the voting digit of each candidate. (Each "digit" is an integral value between zero and one less than the radix.) Thus, a DFP digit is a value between zero and nine. The voting digit is the units digit of the significand when considered in the common rounding point view.

Without changing the value of a floating point number, the significand may be viewed with the implied radix point in different positions, provided a corresponding adjustment is made to the exponent. In the common rounding point view, an implied radix point (called the common rounding point) and an associated exponent are selected for the input value and the two candidates, TZ and AZ. The common rounding point is selected to satisfy the following requirements:

1. The input value and the two candidates all have the same exponent.
2. The significand of TZ is equal to the significand of the input value truncated at the rounding point.
3. The significand of AZ is one greater in magnitude than the significand of TZ.

Another instruction that may be employed in the composition of a DFP entity is a Subtract instruction. One example of a format of a Subtract instruction 1400 is described with reference to FIG. 14. In one example, instruction 1400 is a 32-bit instruction in format RRR as that format is defined in the IBM® z/Architecture Principles of Operation. It includes, for instance:

- An operation code 1402 (e.g., bits 0-15) designating the Subtract instruction. In this example, there are two possible operation codes: one for long DFP, and one for extended DFP.
- A register field 1404 (e.g., $R_3$, bits 16-19) designating a floating point register or a floating point register pair, the contents of which are a third operand.
- A register field 1406 (e.g., $R_1$, bits 24-27) designating a floating point register or a floating point register pair, the contents of which are a first operand.
- A register field 1408 (e.g., $R_2$, bits 28-31) designating a floating point register or a floating point register pair, the contents of which are a second operand.

During execution of the Subtract instruction, the third operand is subtracted from the second operand, and the difference is placed at the first operand location. The execution of Subtract is identical to that of Add, except that the third operand, if numerical, participates in the operation with its sign bit inverted. When the third operand is a NaN, it participates in the operation with its sign bit unchanged.

The second and third operands in the DFP format are converted to the working format using the expand function. The Subtract operation is performed on data in the working format. The result in the working format is converted to the DFP format using the compress function.

When the delivered value is exact, the preferred quantum is the smaller quantum of the two source operands. When the delivered value is inexact, the preferred quantum is the smallest quantum.

The result placed at the first operand location is canonical.

When the opcode of the Subtract instruction indicates an extended DFP, the R fields designate valid floating point register pairs.

Yet another instruction used by the composition process is an Insert Biased Exponent instruction. One example of a format of an Insert Biased Exponent instruction 1500 is described with reference to FIG. 15. In one example, instruction 1500 is a 32-bit instruction in format RRF (register and register operand having an extended opcode field and an additional R or M field) as that format is defined in the IBM® z/Architecture Principles of Operation. It includes, for instance:

- An operation code 1502 (e.g., bits 0-15) designating the Insert Biased Exponent instruction. In this example, there are two possible operation codes: one for a long DFP operand; and another for an extended DFP operand.
- A register field 1504 (e.g., $R_3$, bits 16-19) designating a floating point register or a floating point register pair, the contents of which are a third operand.
- A register field 1506 (e.g., $R_1$, bits 24-27) designating a floating point register or a floating point register pair, the contents of which are a first operand.
- A register field 1508 (e.g., $R_2$, bits 28-31) designating a general register, the contents of which are a second operand. The second operand is a 64-bit signed binary integer.

During execution of the Insert Biased Exponent instruction, a DFP operand is produced by combining the requested biased exponent with the sign bit and the significand of the DFP third operand, and the result is placed in the first operand location.

The Insert Biased Exponent instruction also uses the expand function, as well as the compress function, described above. For instance, the expand function is used to convert the DFP format (of, e.g., the third operand) to the working format. The insert is then performed using the working format, and then the compress function is used to convert the working format back to the DFP format. In particular, as an example, the working format includes a sign, a type, a biased exponent and significand digits. The source biased exponent is examined to set the type of the working format and replace the biased exponent. The sign, the type, the new biased exponent and the new significand are used by the compress function to create the result in the DFP format.

The value of the requested biased exponent is a 64 bit signed binary integer and is located in the general register designated by R2.

When the value of the requested biased exponent is in the range between zero and the maximum biased exponent, inclusively, for the target format, the result is a finite number. The biased exponent of the result is set to the value of the requested biased exponent; the significand of the result is set to the significand of the third operand. If the third operand is an infinity or NaN, the significand of the third operand includes the digits of the trailing significand of the third operand padded with a zero digit on the left.

When the value of the requested biased exponent is −1, the result is an infinity. The reserved field of the result is set to zero; the trailing significand of the result is set to the trailing significand of the third operand.

When the value of the requested biased exponent is equal to −2, less than −3, or greater than the maximum biased exponent for the target format, the result is a QNaN; when the value of the requested biased exponent is −3, the result is an SNaN. When a NaN is produced as the result, the reserved field of the result is set to zero, and the trailing significand of the result is set to the trailing significand of the third operand.

The sign of the result is the same as the sign of the third operand.

The preferred quantum is the quantum that corresponds to the requested biased exponent. If the delivered value is a finite number, it is represented with the preferred quantum.

The result placed at the first operand location is canonical, except for infinity. When the result is an infinity, if all digits in the trailing significand of the third operand are zeros, then the result is a canonical infinity; otherwise, the result is an infinity that has the reserved field set to zero, canonical declets in the encoded trailing significand field, and some nonzero digits in the trailing significand.

This operand is performed for any requested biased exponent and any third operand without causing an IEEE exception.

When the opcode of the Insert Biased Exponent instruction indicates the extended DFP, the $R_1$ and $R_3$ fields designate valid floating point register pairs.

One example of a summary of the results for this instruction are depicted in the below table.

| Value (b) in second operand | Results[1] for INSERT BIASED EXPONENT when third operand (c) is | | | |
|---|---|---|---|---|
| | F | ∞ | QNaN | SNaN |
| b > MBE | T(QNaN) | T(QNaN) | T(QNaN) | T(QNaN) |
| MBE ≥ b ≥ 0 | T(F) | T(F[2]) | T(F[2]) | T(F[2]) |
| b = −1 | N(∞) | N(∞) | N(∞) | N(∞) |
| b = −2 | T(QNaN) | T(QNaN) | T(QNaN) | T(QNaN) |
| b = −3 | T(SNaN) | T(SNaN) | T(SNaN) | T(SNaN) |
| B ≤ −4 | T(QNaN) | T(QNaN) | T(QNaN) | T(QNaN) |

Explanation:
[1] The sign of the result is the same as the sign of the third operand.
[2] The leftmost digit of the significand is zero.
F All infinite numbers, including zeros.
MBE Maximum biased exponent for the target format.
N(∞) The result is a canonical infinity if all digits in the trailing significand of the third operand are zeros; otherwise, the resultant infinity has the reserved field set to zero, canonical declets in the encoded trailing-significand filed, and some nonzero digits in the trailing significand.
T(x) The canonical result x is placed at the target operand location.

Described in detail above is a capability for composing a decimal floating point datum. In accordance with another aspect of the present invention, a capability is provided for decomposing a decimal floating point datum.

One embodiment of an overview of the logic associated with exporting a decimal floating point datum is described with reference to FIG. 16. In this particular example, the exported datum is a non-decimal floating point format, such as a human readable format.

Figure 16:
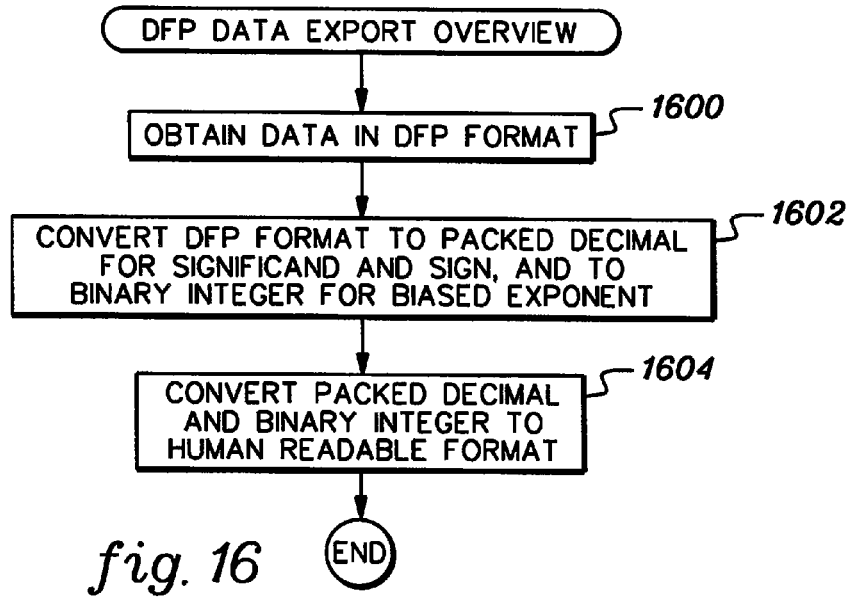
FIG. 16 depicts one embodiment of an overview of the logic associated with exporting a decimal floating point datum, in accordance with an aspect of the present invention.

Referring to FIG. 16, in one embodiment, a decimal floating point datum in a DFP format is obtained by a processor of a processing environment, STEP 1600. The data is converted from its decimal floating point format to an intermediate form, such as packed decimal for the significand and binary integer for the biased exponent, STEP 1602. The intermediate result is then converted to a human readable format, such as a decimal numerical value, STEP 1604. Techniques to convert from packed decimal and binary integer to human-readable format are known in the art.

Further details regarding converting the significand of a DFP datum to packed decimal and the biased exponent of a DFP datum to binary integer are described with reference to FIG. 17. In particular, one embodiment of the logic associated with converting the significand and the biased exponent to a signed packed decimal number and a binary integer, respectively, is described.

Initially, the biased exponent is extracted and placed in a general register, such as general register E, STEP 1700. This extracted biased exponent is a 64-bit signed binary integer. In one example, this extract function is performed using an Extract Biased Exponent instruction, as described below.

Additionally, the lower 31 digits and sign of the significand are converted into packed decimal and the result is stored into a general register pair CD, STEP 1702. In one example, a Convert To Signed Packed instruction is used for this conversion.

Further, the significand stored in floating pair register 01 is shifted 31 digits to the right, using a Shift Significand Right instruction, as an example, STEP 1704.

The remaining digits are converted using a Convert To Unsigned Packed instruction and stored in general register pair AB, STEP 1706. The three digits of the contents of register pair AB and the 31 digits plus the sign of register pair CD are stored in storage, STEP 1708. In one example, the three digits of general register pair AB and the 31 digits plus sign of general register CD are concatenated in storage. Additionally, the contents of general register E are stored in storage, STEP 1710.

In the previous example, the intermediate form includes a signed significand in the signed packed decimal format. Two examples are now given where the intermediate form includes an unsigned significand in the unsigned packed decimal format along with a separate bit for the sign. In these examples, the significand and the sign of a decimal floating point number are converted separately. As in the previous example, the intermediate form also includes a 64-bit biased exponent in the binary integer format. In both examples, the significand in the decimal floating point format is first converted to an unsigned packed decimal number.

As in the previous example, the Extract Biased Exponent instruction is then used to extract the 64-bit biased exponent from the DFP format and place it in the intermediate form. Also, in both examples, the sign bit in the intermediate form is set to indicate the sign of the original number in the DFP format.

In the first example, the 34-digit significand of a decimal floating point number in the DFP extended format is converted to an unsigned packed decimal number using the Convert To Unsigned Packed and Shift Significand Right instructions. The Convert To Signed Packed instruction is not needed.

In the second example, the 16-digit significand of a decimal floating point number in the DFP long format is converted to an unsigned packed decimal number by a single execution of the Convert To Unsigned Packed instruction. The Convert To Signed Packed and Shift Significand Right instructions are not needed.

In other examples, the decomposition can be to other types of non-decimal floating point formats.

In the above logic for decomposing a decimal floating point datum, a number of instructions are employed. These instructions can be implemented in many architectures and may be emulated. As examples, the instructions are executed in hardware by a processor; by software executed on a processor having a native instruction set; or by emulation of a non-native instruction set that includes the instruction. In one particular example, the instructions are implemented in the z/Architecture® offered by International Business Machines Corporation, Armonk, N.Y.

Figure 18:
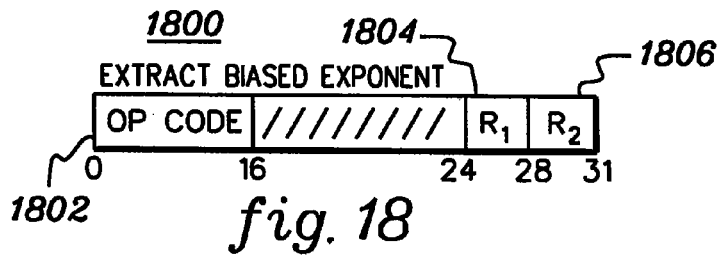
FIG. 18 depicts one example of a format of an Extract Biased Exponent instruction used in accordance with an aspect of the present invention.

One instruction used by the decomposition process is an Extract Biased Exponent instruction. One example of a format of an Extract Biased Exponent instruction 1800 is described with reference to FIG. 18. In one example, instruction 1800 is a 32-bit instruction in format RRE (register and register operation having an extended opcode field) as that format is defined in the IBM® z/Architecture Principles of Operation. It includes, for instance:

An operation code 1802 (e.g., bits 0-15) designating the Extract Biased Exponent instruction. In this example, there are two possible operation codes: one for a long DFP source, 64-bit binary integer result; and another for a 64-bit binary integer result, extended DFP source.

A register field 1804 (e.g., $R_1$, bits 24-27) designating a general register, the contents of which are a first operand.

A register field 1806 (e.g., $R_2$, bits 28-31) designating a floating point register or a floating point register pair, the contents of which are a second operand.

During execution of the Extract Biased Exponent instruction, the biased exponent of the DFP second operand is placed at the first operand location. In particular, when the second operand is a finite number, the biased exponent of the second operand is placed into the first operand location. When the second operand is an infinity, QNaN, or SNaN, a special code is placed into the first operand location.

The Extract Biased Exponent instruction uses the expand function described above during execution. For instance, the expand function is used to convert the DFP format (of, e.g., the second operand) to the working format, and then the extraction is performed using the working format. In particular, as an example, the type of the working format is examined and the extract function is performed according to the type. If it is a finite number, the bias exponent is extracted as a binary integer result. If it is an infinity or NaN, the extract returns a special code depending on the type (a.k.a., data class).

This operation is performed for any second operand without causing an IEEE exception.

When the opcode of the Extract Biased Exponent instruction indicates the extended DFP operand, the $R_2$ field designates a valid floating point register pair.

The result is a 64-bit signed binary integer that is placed in the general register designated by $R_1$. One example of a summary of the results for this instruction are depicted in the below table.

| Second-operand data class | First-operand value |
|---|---|
| Finite number | e |
| Infinity | −1 |
| QNaN | −2 |
| SNaN | −3 |

Explanation:
e Biased exponent

Figure 19:
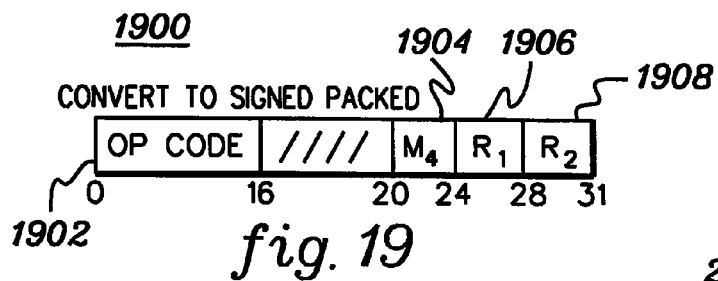
FIG. 19 depicts one example of a format of a Convert To Signed Packed instruction used in accordance with an aspect of the present invention.

Another instruction used is the Convert To Signed Packed instruction. One example of a format of the Convert To Signed Packed instruction 1900 is described with reference to FIG. 19. In one example, instruction 1900 is a 32 bit instruction in format RRF (register and register operation having an extended opcode and an addition R or M field) as that format is defined in the IBM® z/Architecture Principles of Operation. It includes, for instance:
  An operation code 1902 (e.g., bits 0-15) designating the Convert To Signed Packed instruction. In this example, there are two possible operation codes: one for a 64-bit signed packed decimal result, long DFP source; and another for a 128-bit signed packed decimal result, extended DFP source.
  A field 1904 (e.g., $M_4$, bits 20-23) used during processing of this instruction, as described below.
  A register field 1906 (e.g., $R_1$, bits 24-27) designating a general register or a general register pair, the contents of which are a first operand used by the instruction.
  A register field 1908 (e.g., $R_2$, bits 28-31) designating a floating point register or a floating point register pair, the contents of which are a second operand used by the instruction.

During execution of the Convert To Signed Packed instruction, the expand function described above is used. In particular, the expand function converts the source operands in the DFP format to the working format and the conversion is performed on this working format.

When the opcode of the Convert To Signed Packed instruction indicates a long DFP operand, the rightmost 15 significand digits and the signed bit of the DFP second operand are converted to a 64-bit result (15 4-bit decimal digits and a 4-bit sign) in the signed packed decimal format.

When the opcode indicates an extended DFP operand, the rightmost 31 digits in the trailing significand and the sign bit of the second operand are converted to a 128-bit result (31 4-bit decimal digits and a 4-bit sign).

The sign of the result is the sign of the second operand.

Bit 3 of the $M_4$ field ($M_4.3$) is the + sign code selection bit. When $M_4.3$ is zero, the plus sign is encoded as 1100; when the bit is one, the plus sign is encoded as 1111. Bits 0-2 are ignored.

The result is a signed packed decimal number that is placed in the general register or general register pair designed by $R_1$.

For an extended DFP source instruction, the $R_2$ field designates a valid floating point register pair. Also, the $R_1$ field designates an even/odd pair of general registers in which the even number register is designated.

Figure 17:
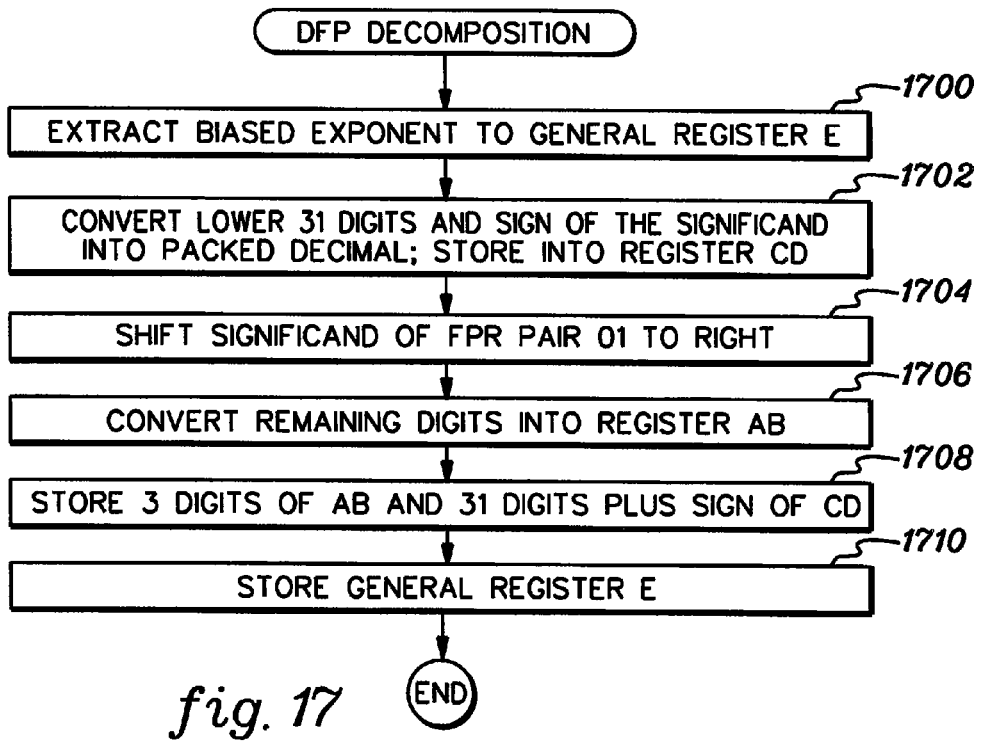
FIG. 17 depicts further details of one embodiment of the logic associated with decomposing a decimal floating point datum, in accordance with an aspect of the present invention.
Figure 20:
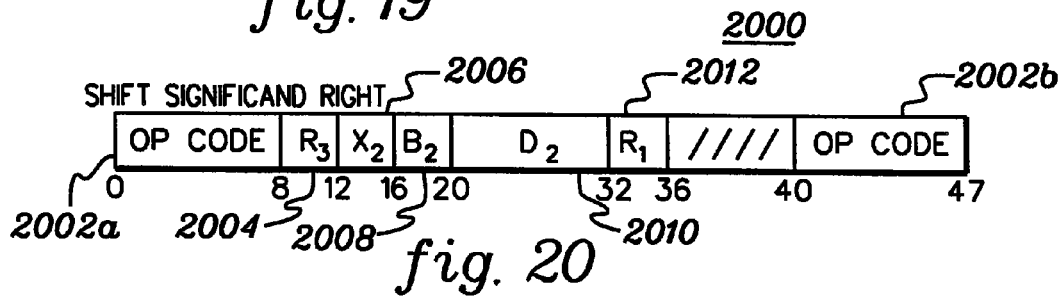
FIG. 20 depicts one example of a format of a Shift Significand Right instruction used in accordance with an aspect of the present invention.

Another instruction used during the decomposition of a DFP entity is a Shift Significand Right instruction (see, e.g., STEP 1704, FIG. 17). One example of a format of the Shift Significand Right instruction 2000 is described with reference to FIG. 20. In one example, instruction 2000 is a 48-bit instruction in format RXF (register and index storage operation having an extended opcode field and an additional register field) as that format is defined in the IBM® z/Architecture Principles of Operation. It includes, for instance:
  An operation code 2002*a* (e.g., bits 0-7), 2002*b* (e.g., bits 40-47) designating the Shift Significand Right instruction. In this example, there are two possible operation codes: one for long decimal floating point operand, and another for an extended decimal floating point operand.
  A register field 2004 (e.g., $R_3$, bits 8-11) designating a floating point register or a floating point register pair, the contents of which are a third operand used by the instruction.
  An index field 2006 (e.g., $X_2$, bits 12-15) designating a general register having, for instance, a 64-bit number.
  A base field 2008 (e.g., $B_2$, bits 16-19) designating a general register having, for instance, a 64-bit number.
  A displacement value 2010 having, for instance, a 12-bit number.
  The contents of the general registers specified in fields 2006 and 2008, if any, are added to the contents of displacement value 2010 to form a second operand address. The second operand address is not used to address data; instead, its rightmost six bits indicate the number of digits to be shifted. The remainder of the address is ignored.
  A register field 2012 (e.g., $R_1$, bits 32-35) designating another floating point register or floating point register pair used by the instruction, the contents of which are a first operand used by the instruction.

During operation, the significand of the third operand is shifted right the number of digits specified by the second operand address, and the result is placed at the first operand location.

To perform the Shift, in one example, an expand function is used to convert the format of the DFP value being shifted to a working format. The shift is performed on the working format, and then the compress function is performed to convert the working format into the DFP format.

Digits shifted out of the rightmost digit are lost. Zeros are supplied to the vacated positions on the left. The sign of the result is the same as the sign of the third operand.

For a finite number, all digits in the significand participate in the shift and the result is a finite number with the same biased exponent as the third operand and the shifted significand. For an infinity, all digits in the trailing significand participate in the shift, and the result is an infinity with the shifted trailing significand and a zero in the reserved field of the format. For a QNaN or SNaN, all digits in the trailing significand participate in the shift and the result is a QNaN or SNaN, respectively, with the shifted trailing significand and a zero in the reserved field of the format.

The preferred quantum is the quantum of the third operand. If the delivered value is a finite number, it is represented with the preferred quantum.

The result placed at the first operand location is canonical, except for infinity. When the result is an infinity, if all digits in the trailing significand of the result are zeros, then the result is canonical; otherwise, the result is an infinity that has the reserved field set to zero, canonical declets in the encoded trailing significand field, and some nonzero digits in the trailing significand.

This operation is performed for any second operand, including an infinity, QNaN, or SNaN, without causing an IEEE exception.

When the opcode of the Shift Significand Right instruction indicates an extended DFP operation, the $R_1$ and $R_3$ fields designate valid floating point register pairs.

Figure 21:
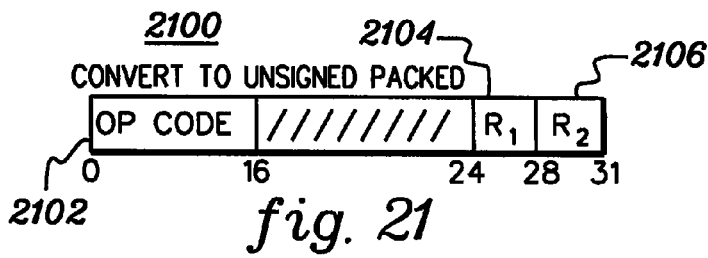
FIG. 21 depicts one example of a format of a Convert To Unsigned Packed instruction used in accordance with an aspect of the present invention.

Another instruction used to convert the DFP value to a BCD value (see, e.g., STEP 1706, FIG. 17) is the Convert To Unsigned Packed instruction 2100, which is described with reference to FIG. 21. In one example, instruction 2100 is a 32-bit instruction in format RRE (register and register operation having an extended opcode) as that format is defined in the IBM® z/Architecture Principles of Operation. It includes, for instance:

An operation code 2102 (e.g., bits 0-15) designating the Convert To Unsigned Packed instruction. In this example, there are two possible operation codes: one for a 64-bit unsigned packed decimal result, long DFP source; and another for a 128-bit unsigned packed decimal result, extended DFP source.

A register field 2104 (e.g., $R_1$, bits 24-27) designating a general register or a general register pair, the contents of which are a first operand used by the instruction.

A register field 2106 (e.g., $R_2$, bits 28-31) designating a floating point register or floating point register pair, the contents of which are a second operand used by the instruction.

During execution of the convert to unsigned packed instruction, the expand function is used in which the DFP format is converted to a working format and the working format is used during execution of the instruction.

When the opcode of the Convert To Unsigned Packed instruction indicates a long DFP source, 16 significant digits of the second operand are converted to a 64-bit result (16 4-bit decimal digits). (If the second operand is an infinity or NaN, the 15 digits in the trailing significand are padded with a zero digit on the left to form 16 significand digits.)

When the opcode indicates an extended DFP source, the rightmost 32 digits in the trailing significand of the second operand are converted to a 128-bit result (32 4-bit decimal digits).

The result is an unsigned packed decimal number that is placed in the general register or general register pair designated by $R_1$.

This operation is performed for any second operand, including an infinity QNaN, or SNaN, without causing an IEEE exception.

When the operand indicates an extended DFP operand, the $R_2$ field designates a valid floating point register pair. Also, the $R_1$ field designates an even/odd pair of general registers in which the even number register is designated.

Figure 22:
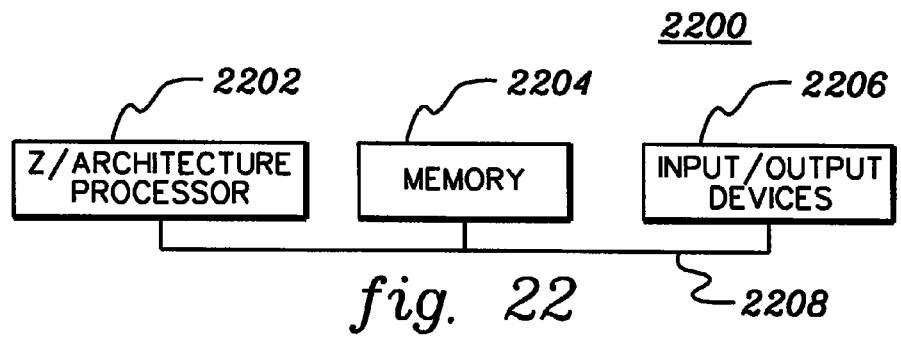
FIG. 22 depicts one embodiment of a processing environment to incorporate and use one or more aspects of the present invention.

In one embodiment, each instruction is executed by a processor of a processing environment. One embodiment of a processing environment to incorporate and use one or more aspects of the present invention is described with reference to FIG. 22. Processing environment 2200 includes, for instance, a z/Architecture® processor 2202 (e.g., a central processing unit (CPU)), a memory 2204 (e.g., main memory), and one or more input/output (I/O) devices 2206 coupled to one another via, for example, one or more buses 2208 and/or other connections.

In the example shown, z/Architecture® processor 2202 is a part of a System z™ server, offered by International Business Machines Corporation (IBM®), Armonk, N.Y. System z™ servers implement IBM's z/Architecture®, which specifies the logical structure and functional operation of the computer. The System z™ server executes an operating system, such as z/OS®, also offered by International Business Machines Corporation. IBM®, z/Architecture® and z/OS® are registered trademarks of International Business Machines Corporation, Armonk, N.Y., USA. Other names used herein may be registered trademarks, trademarks or product names of International Business Machines Corporation or other companies.

In another embodiment, the instruction and/or the logic of the instruction can be executed in a processing environment that is based on one architecture (which may be referred to as a "native" architecture), but emulates another architecture (which may be referred to as a "guest" architecture). In such an environment, for example, the instructions and/or logic thereof, which is specified in the z/Architecture® and designed to execute on a z/Architecture® machine, is emulated to execute on an architecture other than the z/Architecture®. One example of this processing environment is described with reference to FIGS. 23-24.

Figure 23:
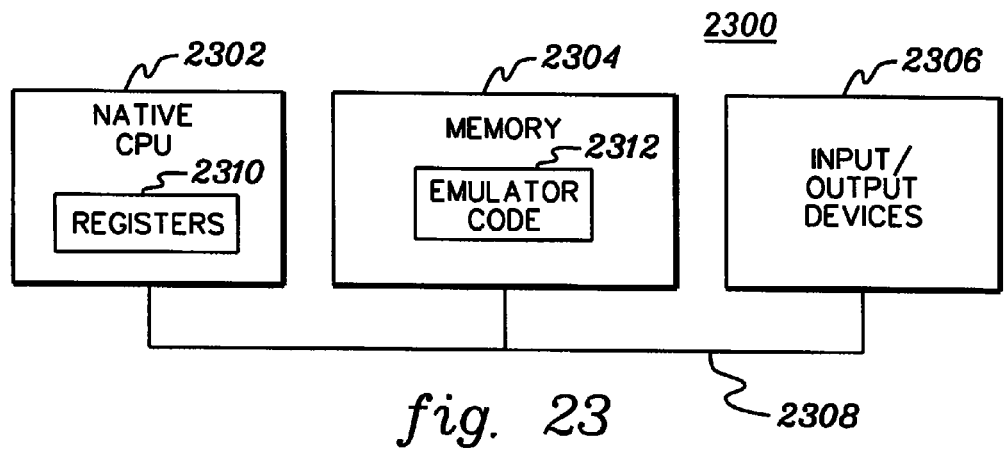
FIG. 23 depicts another embodiment of a processing environment to incorporate and use one or more aspects of the present invention.

Referring to FIG. 23, one embodiment of a processing environment to incorporate and use one or more aspects of the present invention is described. Processing environment 2300 includes, for instance, a native central processing unit 2302, a memory 2304 (e.g., main memory) and one or more input/output (I/O) devices 2306 coupled to one another via, for example, one or more buses 2308 and/or other connections. As examples, processing environment 2300 may include a Power PC® processor, a pSeries® server, or an xSeries® server offered by International Business Machines Corporation, Armonk, N.Y.; an HP Superdome with Intel® Itanium® 2 processors offered by Hewlett-Packard Company, Palo Alto, Calif.; and/or other machines based on architectures offered by IBM®, Hewlett-Packard, Intel®, Sun Microsystems or others. Power PC®, pSeries® and xSeries® are registered trademarks of International Business Machines Corporation, Armonk, N.Y., U.S.A. Intel® and Itanium® 2 are registered trademarks of Intel Corporation, Santa Clara, Calif.

Native central processing unit 2302 includes one or more native registers 2310, such as one or more general purpose registers and/or one or more special purpose registers, used during processing within the environment. These registers include information that represent the state of the environment at any particular point in time.

Moreover, native central processing unit 2302 executes instructions and code that are stored in memory 2304. In one particular example, the central processing unit executes emulator code 2312 stored in memory 2304. This code enables the processing environment configured in one architecture to emulate another architecture. For instance, emulator code 2312 allows machines based on architectures other than the z/Architecture®, such as Power PC® processors, pSeries® servers, xSeries® servers, HP Superdome® servers, or others to emulate the z/Architecture® and to execute software and instructions developed based on the z/Architecture®.

Figure 24:
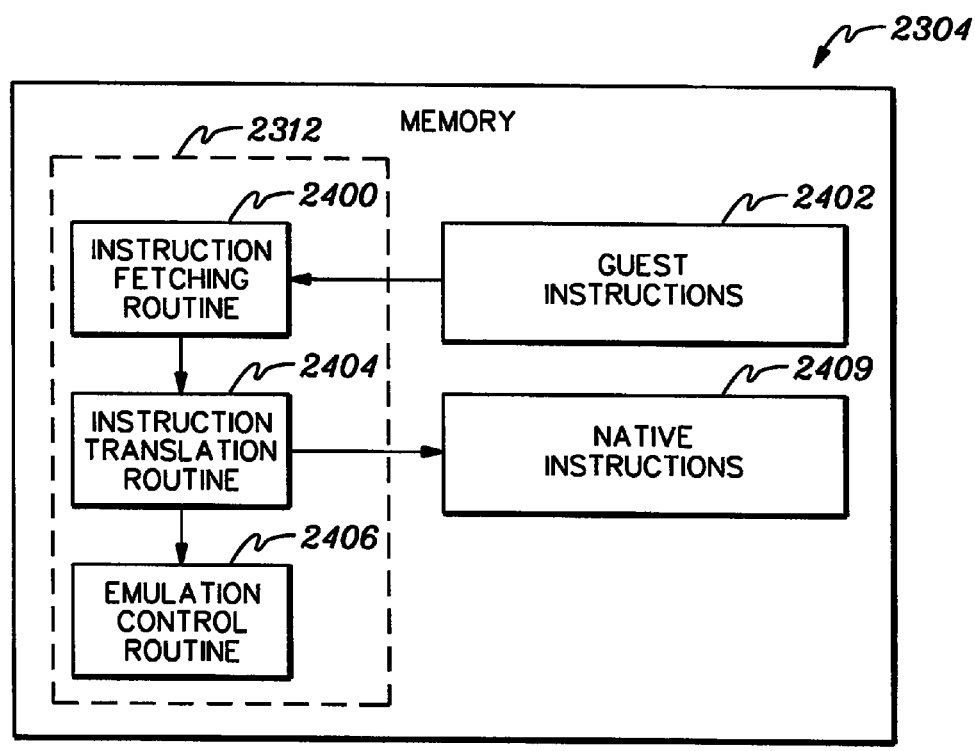
FIG. 24 depicts further details of the memory of FIG. 23, in accordance with an aspect of the present invention.

Further details relating to emulator code 2312 are described with reference to FIG. 24. Guest instructions 2402 comprise software instructions (e.g., machine instructions) that were developed to be executed in an architecture other than that of native CPU 2302. For example, guest instructions 2402 may have been designed to execute on z/Architecture® processor 2202, but are instead being emulated on native CPU 2302 (which may be for example an Intel® Itanium® 2 processor). In one example, emulator code 2312 includes an instruction fetching routine 2400 to obtain one or more guest instructions 2402 from memory 2304, and to optionally provide local buffering for the instruction obtained. It also includes an instruction translation routine 2404 to determine the type of guest instruction that has been obtained and to translate the guest instruction into one or more corresponding native instructions 2409. This translation includes, for instance, identifying the function to be performed by the guest instruction and choosing the native instructions to perform that function.

Further, emulator 2312 includes an emulation control routine 2406 to cause the native instructions to be executed. Emulation control routine 2406 may cause native CPU 2302 to execute a routine of native instructions that emulate one or more previously obtained guest instructions and, at the conclusion of such execution, to return control to the instruction fetch routine to emulate the obtaining of the next guest instruction or group of guest instructions. Execution of the native instructions 2409 may include loading data into a register from memory 2304; storing data back to memory from a register; or performing some type of arithmetic or logical operation, as determined by the translation routine.

Each routine is, for instance, implemented in software, which is stored in memory and executed by the native central processing unit 2302. In other examples, one or more of the routines or operations are implemented in firmware, hardware, software or some combination thereof. The registers of the emulated guest processor may be emulated using the registers 2310 of the native CPU or by using locations in memory 2304. In embodiments, the guest instructions 2402, native instructions 2409, and emulation code 2312 may reside in the same memory or may be dispersed among different memory devices.

In one example, a guest instruction 2402 that is obtained, translated and executed is one of the instructions described herein. The instruction, which is a z/Architecture® instruction in this example, is fetched from memory, translated and represented as a sequence of native instructions 2409 (e.g., Power PC®, pSeries®, xSeries®, Intel®, etc.) which are executed.

In another embodiment, one or more of the instructions are executed in another architecture environment including, for example, an architecture as described in the "INTEL® 64 and IA-32 Architectures Software Developer's Manual Volume 1," Order Number 253665-022US, November 2006; "INTEL® 64 and IA-32 Architectures Software Developer's Manual Volume 2A," Order Number 253666-022US, November 2006; the "INTEL® Itanium® Architecture Software Developer's Manual Volume 1," Doc. No. 245317-005, January 2006; the "INTEL® Itanium® Architecture Software Developer's Manual Volume 2," Doc. No. 245318-005, January 2006; and/or the "INTEL® Itanium® Architecture Software Developer's Manual Volume 3," Doc. No. 245319-005, January 2006; each of which is hereby incorporated herein by reference in its entirety.

In yet a further embodiment, a data processing system suitable for storing and/or executing program code is usable that includes at least one processor coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

One or more aspects of the present invention can be included in an article of manufacture (e.g., one or more computer program products) having, for instance, computer usable media. The media has therein, for instance, computer readable program code means or logic (e.g., instructions, code, commands, etc.) to provide and facilitate the capabilities of the present invention. The article of manufacture can be included as a part of a system (e.g., computer system) or sold separately.

Figure 25:
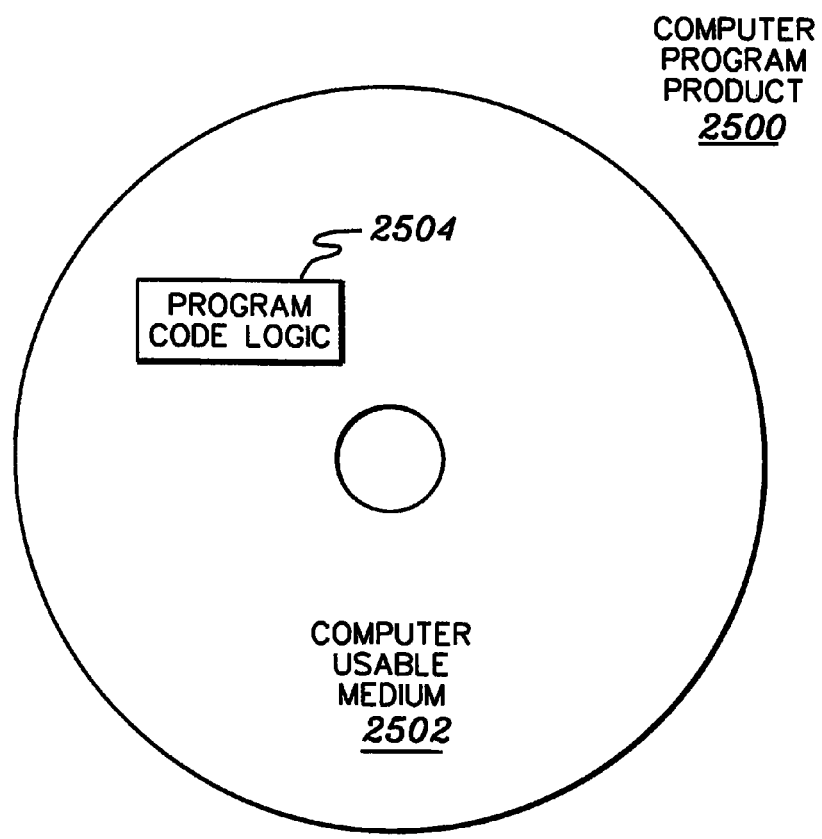
FIG. 25 depicts one example of a computer program product to incorporate one or more aspects of the present invention.

One example of an article of manufacture or a computer program product incorporating one or more aspects of the present invention is described with reference to FIG. 25. A computer program product 2500 includes, for instance, one or more computer usable media 2502 to store computer readable program code means or logic 2504 thereon to provide and facilitate one or more aspects of the present invention. The medium can be an electronic, magnetic, optical, electromagnetic, infrared, or semiconductor system (or apparatus or device) or a propagation medium. Examples of a computer readable medium include a semiconductor or solid state memory, magnetic tape, a removable computer diskette, a random access memory (RAM), a read-only memory (ROM), a rigid magnetic disk and an optical disk. Examples of optical disks include compact disk-read only memory (CD-ROM), compact disk-read/write (CD-RAN) and DVD.

A sequence of program instructions or a logical assembly of one or more interrelated modules defined by one or more computer readable program code means or logic direct the performance of one or more aspects of the present invention.

Although one or more examples have been provided herein, these are only examples. Many variations are possible without departing from the spirit of the present invention. For instance, processing environments other than the examples provided herein may include and/or benefit from one or more aspects of the present invention. As an example, a processor can be other than an IBM System z™ processor and can execute an operating system other than z/OS®. Further, the environment need not be based on the z/Architecture®, but instead can be based on other architectures offered by, for instance, IBM®, Intel®, Sun Microsystems, as well as others. Yet further, the environment can include multiple processors, be partitioned, and/or be coupled to other systems, as examples.

Additionally, one or more of the instructions can include other registers or entities other than registers to designate information. Further, although examples of registers are described above, each of the registers may include more, less or different information. Further, each may include additional data not necessarily needed in one or more aspects of the present invention. Specific location within the registers for the information is implementation and/or architecture dependent. Yet further, different data and/or positioning within the registers and/or entities are possible.

Still further, one or more aspects of the present invention can be usable with other floating point systems, including variations on the decimal floating point described herein. Further, the formats of decimal floating point numbers, as well as properties and any other characteristics, including but not limited to, the contents of the data formats may be different than described herein. A decimal floating point number can be defined as having more, less or different components than described herein; definitions can vary; and/or there can be more, less or different formats.

Moreover, one or more aspects of the present invention also apply to implementations using BID (Binary Encoded Decimal Floating Point data) encoding, as well as other encoding.

In an embodiment wherein the significand is Binary Encoded Decimal (BID) format rather than DPD, the BID significand is decoded to a decimal value, such as packed decimal, for example, such that each decimal digit is represented by a distinct 4 bit value. The decimal value is operated on according to the function required and the result is re-encoded into the BID format, thereby the BID significand is operated on as a decimal number rather than a binary number. In one example, the function required is a shift operation on the significand. The shift operation is performed on the decimal number such that the value of the decimal number is shifted by a predetermined number of decimal digit positions. The shifted value is then encoded into BID format and saved as a result operand.

As used herein, the term "obtaining" as in, for instance, "obtaining an instruction" includes, but is not limited to, fetching, receiving, having, providing, being provided, creating, developing, etc.

The capabilities of one or more aspects of the present invention can be implemented in software, firmware, hardware, or some combination thereof. At least one program storage device readable by a machine embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted, or modified. All of these variations are considered a part of the claimed invention.

Although embodiments have been depicted and described in detail herein, it will be apparent to those skilled in the relevant art that various modifications, additions, substitutions and the like can be made without departing from the spirit of the invention, and these are, therefore, considered to be within the scope of the invention as defined in the claims.

We claim:

1. A method of executing a machine instruction by a central processing unit, said method comprising:
    obtaining a machine instruction for execution, the machine instruction comprising an opcode and being defined for computer execution according to a computer architecture; and
    executing the machine instruction, the executing comprising:
        obtaining, by at least one processor of a processing environment, a significand of a datum in a first format and an exponent of the datum in a second format;
        converting the significand in the first format to the significand in a decimal floating point format;
        converting the exponent in the second format to a biased exponent;
        and combining the significand in the decimal floating point format and the biased exponent to create the datum in the decimal floating point format.

2. The method of claim 1, wherein the first format comprises a packed decimal format, the second format comprises a signed binary integer and the biased exponent comprises an unsigned binary integer format.

3. The method of claim 1, further comprising providing a sign for the datum.

4. The method of claim 1, wherein an encoding of the datum in decimal floating point format comprises including a sign of the datum in a sign field, a leftmost digit of the significand, two leftmost bits of the biased exponent and the remaining bits of the biased exponent in a combination field, and the remaining digits of the significand in an encoded trailing significand field.

5. The method of claim 4, wherein the sign field is bit 0 of the decimal floating point format, the combination field is bits 1-11, bits 1-13 or bits 1-17 depending on a length of the data format, and the encoded trailing significand is bits 12-31, bits 14-63 or bits 18-127 depending on the length of the data format.

6. The method of claim 1, wherein converting the significand comprises:
    loading a number of most significant digits of the significand in a first register pair; loading the remaining least significant digits of the significand in a second register pair;
    converting contents of the first register pair into the decimal floating point format, and storing the converted contents in a first floating point register pair;
    converting contents of the second register pair into the decimal floating point format, and storing the converted contents in a second floating point register pair;
    shifting the contents of the first floating point register pair a selected number of digits to the left to align it for operations with the second floating point register pair;
    determining a sign of the significand;
    subtracting contents of the first floating point register pair from the contents of the second floating point register pair and storing the result in the first floating point register pair, in response to the determining indicating a negative sign; and
    adding contents of the first floating point register pair and the second floating point register pair and storing the result in the first floating point register pair, in response to the determining indicating a positive sign.

7. The method of claim 6, wherein the combining comprises combining the biased exponent with the result stored in the first floating point register pair to create the datum in decimal floating point format.

8. The method of claim 7, wherein the combining comprises employing an insert biased exponent instruction to perform the combining.

9. The method of claim 6, wherein the converting contents of the first register pair comprises using a convert from unsigned packed instruction to perform the converting.

10. The method of claim 6, wherein the converting contents of the second register pair comprises employing a convert from signed packed instruction to perform the converting.

11. The method of claim 6, wherein the shifting comprises employing a shift left instruction to perform the shifting.

12. The method of claim 6, wherein the subtracting comprises employing a subtract instruction to perform the subtracting.

13. The method of claim 6, wherein the adding comprises employing an add instruction to perform the adding.

14. The method of claim 1, wherein the combining comprises employing an insert biased instruction to combine the significand with the biased exponent to create the datum in the decimal floating point format.

* * * * *